United States Patent
Abe et al.

(10) Patent No.: US 9,401,396 B2
(45) Date of Patent: Jul. 26, 2016

(54) METHOD FOR MANUFACTURING SEMICONDUCTOR DEVICE AND PLASMA OXIDATION TREATMENT METHOD

(75) Inventors: Kanta Abe, Kanagawa (JP); Hidekazu Miyairi, Kanagawa (JP); Tetsuhiro Tanaka, Kanagawa (JP); Takashi Ienaga, Oume (JP); Yoshitaka Yamamoto, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 654 days.

(21) Appl. No.: 13/433,563

(22) Filed: Mar. 29, 2012

(65) Prior Publication Data
US 2012/0270383 A1  Oct. 25, 2012

(30) Foreign Application Priority Data
Apr. 19, 2011 (JP) ................. 2011-093226

(51) Int. Cl.
*H01L 21/20* (2006.01)
*H01L 21/36* (2006.01)
(Continued)

(52) U.S. Cl.
CPC .......... *H01L 29/04* (2013.01); *H01L 21/28008* (2013.01); *H01L 29/66765* (2013.01); *H01L 29/786* (2013.01); *H01L 29/78678* (2013.01); *H01L 29/78696* (2013.01); *H01L 29/78648* (2013.01)

(58) Field of Classification Search
CPC ............ H01L 29/786; H01L 29/78603; H01L 29/78645; H01L 29/78648; H01L 29/78672; H01L 29/78678; H01L 29/4908
USPC .............. 257/40, 43, 57, 59, 72; 438/85, 104, 438/149, 151
See application file for complete search history.

(56) References Cited

U.S. PATENT DOCUMENTS 4,409,134 A  10/1983 Yamazaki
6,153,893 A  11/2000 Inoue et al.
(Continued)

FOREIGN PATENT DOCUMENTS

CN  001926692 A  3/2007
CN  101926007 A  12/2010
(Continued)

*Primary Examiner* — Thanh Y Tran
(74) *Attorney, Agent, or Firm* — Eric J. Robinson; Robinson Intellectual Property Law Office, P.C.

(57) ABSTRACT

Provided is a method for manufacturing a semiconductor device, in which a degradation of characteristics of a thin film transistor can be suppressed by performing plasma oxidation treatment on a gate insulating film containing nitrogen. An embodiment of the present invention is a method for manufacturing a semiconductor device comprising a thin film transistor including a gate electrode, a gate insulating film containing nitrogen, and a channel region in microcrystalline semiconductor films. The method includes the steps of performing plasma treatment on the gate insulating film in an oxidizing gas atmosphere containing hydrogen and an oxidizing gas containing an oxygen atom, and forming the microcrystalline semiconductor film over the gate insulating film. Formula (1), a/b≥2, and Formula (2), b>0, are satisfied, where the amount of hydrogen and the amount of the oxidizing gas in the oxidizing gas atmosphere are a and b, respectively.

4 Claims, 12 Drawing Sheets

(51) Int. Cl.
*H01L 29/04* (2006.01)
*H01L 29/66* (2006.01)
*H01L 21/28* (2006.01)
*H01L 29/786* (2006.01)

(56) References Cited

U.S. PATENT DOCUMENTS

| | | | |
|---|---|---|---|
| 6,323,142 | B1 | 11/2001 | Yamazaki et al. |
| 6,468,839 | B2 | 10/2002 | Inoue et al. |
| 6,706,648 | B2 | 3/2004 | Yamazaki et al. |
| 7,465,677 | B2 | 12/2008 | Isobe et al. |
| 7,491,659 | B2 | 2/2009 | Yamazaki et al. |
| 7,551,655 | B2 | 6/2009 | Tanaka et al. |
| 7,718,547 | B2 | 5/2010 | Isobe et al. |
| 7,981,785 | B2 | 7/2011 | Sasaki et al. |
| 8,003,989 | B2 | 8/2011 | Nakajima et al. |
| 8,023,055 | B2 | 9/2011 | Nakajima et al. |
| 8,318,554 | B2 | 11/2012 | Arai et al. |
| 8,624,321 | B2 | 1/2014 | Yamazaki et al. |
| 8,895,388 | B2 | 11/2014 | Kakehata et al. |
| 2004/0127069 | A1* | 7/2004 | Yamazaki et al. ............ 438/778 |
| 2006/0172551 | A1* | 8/2006 | Chua .................. H01J 37/321 438/770 |
| 2006/0246738 | A1* | 11/2006 | Isobe et al. ................... 438/769 |
| 2007/0117406 | A1* | 5/2007 | Saito ............................. 438/762 |
| 2007/0252234 | A1* | 11/2007 | Kawamata et al. ........... 257/506 |
| 2008/0290393 | A1* | 11/2008 | Kakehata et al. ............. 257/316 |
| 2009/0033818 | A1 | 2/2009 | Nakajima et al. |
| 2009/0098720 | A1* | 4/2009 | Isobe et al. .................... 438/591 |
| 2009/0236600 | A1* | 9/2009 | Yamazaki .............. H01L 29/04 257/59 |
| 2010/0295047 | A1 | 11/2010 | Moriguchi et al. |
| 2012/0061676 | A1* | 3/2012 | Egi et al. ......................... 257/60 |

FOREIGN PATENT DOCUMENTS

| | | |
|---|---|---|
| EP | 0 535 979 | 4/1993 |
| EP | 0 652 595 | 5/1995 |
| EP | 1 537 938 | 6/2005 |
| EP | 1717847 A | 11/2006 |
| JP | 05-129608 | 5/1993 |
| JP | 07-131030 | 5/1995 |
| JP | 09-082706 A | 3/1997 |
| JP | 11-040813 | 2/1999 |
| JP | 11-177104 A | 7/1999 |
| JP | 2001-053283 | 2/2001 |
| JP | 2005-049832 | 2/2005 |
| JP | 2005-191546 | 7/2005 |
| JP | 2006-332606 A | 12/2006 |
| JP | 2006-332634 A | 12/2006 |
| JP | 2008-047884 | 2/2008 |
| JP | 2009-260277 A | 11/2009 |
| JP | 2010-123925 | 6/2010 |
| JP | 2012-169601 | 9/2012 |

* cited by examiner

METHOD FOR MANUFACTURING SEMICONDUCTOR DEVICE AND PLASMA OXIDATION TREATMENT METHOD

BACKGROUND OF THE INVENTION

1. Field of the Invention

The present invention relates to a method for manufacturing a semiconductor device, a plasma oxidation treatment method, and the like.

2. Description of the Related Art

As one type of field-effect transistor, a thin film transistor whose channel region is formed using a silicon film which is formed over a substrate having an insulating surface is known. Techniques in which amorphous silicon, microcrystalline silicon, or polycrystalline silicon is used for forming the silicon film which is used for the channel region of the thin film transistor have been disclosed (see Patent Documents 1 to 5). A typical application of the thin film transistor is a liquid crystal television device, in which the thin film transistor is practically used as a switching transistor in each pixel in a display screen.

FIG. 13 is a cross-sectional view of an inverted staggered bottom-gate thin film transistor. This thin film transistor includes a gate electrode 4 having a stacked structure and formed over a glass substrate 10; a gate insulating film 2 formed of a $SiN_X$ film that is formed to cover the gate electrode 4; a stacked film in which a microcrystalline silicon film 1, a silicon film 3, and a pair of impurity silicon films 5a and 5b are stacked over the gate insulating film 2; wirings 6a and 6b having a stacked structure over the impurity silicon films 5a and 5b and functioning as a source and drain electrodes; an insulating film 7 formed to cover the wirings 6a and 6b; and a gate electrode (hereinafter referred to as a back gate electrode) 8 formed over the insulating film 7.

In the case of forming an insulating film containing nitrogen such as a $SiN_X$ film as the gate insulating film 2, nitrogen in the gate insulating film 2 inhibits crystallization at the time of forming the microcrystalline silicon film 1 on an upper portion 2a of the gate insulating film 2, whereby an amorphous silicon region (so-called incubation layer) is formed on the gate insulating film 2. This silicon region may cause degradation of characteristics of the thin film transistor.

At the time right after a portion 3a, which is located on the back channel side in the silicon film 3, is exposed by dry etching the silicon film 3 over the microcrystalline silicon film 1, a silicon region in the surface of the portion 3a in which the back channel is formed is damaged by the etching; this may result in a degradation of characteristics of the thin film transistor. Note that the back channel means a region facing the back gate electrode and positioned in the microcrystalline silicon film 1 or the silicon film 3.

REFERENCE

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546

SUMMARY OF THE INVENTION

An object of an embodiment of the present invention is to provide a method for manufacturing a semiconductor device, in which a degradation in characteristics of a thin film transistor can be suppressed by performing plasma oxidation treatment on a gate insulating film containing nitrogen. Further, another object of an embodiment of the present invention is to provide a method for manufacturing a semiconductor device, in which a degradation in characteristics of a thin film transistor can be suppressed by performing plasma oxidation treatment on a back channel side of a semiconductor film. Furthermore, another object of an embodiment of the present invention is to provide a plasma oxidation treatment method with improved oxidizing power.

An embodiment of the present invention is a method for manufacturing a semiconductor device which includes a thin film transistor including a gate electrode, a gate insulating film containing nitrogen, and a channel region in a microcrystalline semiconductor film, including the steps of performing plasma treatment in which the gate insulating film is exposed to plasma in an oxidizing gas atmosphere containing hydrogen and an oxidizing gas containing an oxygen atom; and forming the microcrystalline semiconductor film over the gate insulating film, in which Formula (1) and Formula (2), preferably Formula (2) and Formula (3), further preferably Formula (2) and Formula (4), still further preferably Formula (2) and Formula (5) are satisfied, where that the amount of hydrogen and the amount of the oxidizing gas in the oxidizing gas atmosphere are a and b, respectively.

$$a/b \geq 2 \tag{1}$$

$$b > 0 \tag{2}$$

$$a/b > 2 \tag{3}$$

$$a/b \geq 3 \tag{4}$$

$$a/b \geq 4 \tag{5}$$

An embodiment of the present invention is a method for manufacturing a semiconductor device which includes a thin film transistor including a gate electrode, a gate insulating film containing nitrogen, and a channel region in a microcrystalline semiconductor film, including the steps of performing plasma treatment in which the microcrystalline semiconductor film is exposed to plasma in an oxidizing gas atmosphere containing hydrogen and an oxidizing gas containing an oxygen atom; forming an insulating film over the microcrystalline semiconductor film; and forming a back gate electrode over the insulating film, in which Formula (6) and Formula (7), preferably Formula (7) and Formula (8), further preferably Formula (7) and Formula (9), still further preferably Formula (7) and Formula (10) are satisfied, where the amount of hydrogen and the amount of the oxidizing gas in the oxidizing gas atmosphere are c and d, respectively.

$$c/d \geq 2 \tag{6}$$

$$d > 0 \tag{7}$$

$$c/d > 2 \tag{8}$$

$$c/d \geq 3 \tag{9}$$

$$c/d \geq 4 \tag{10}$$

An embodiment of the present invention is a method for manufacturing a semiconductor device which includes a thin film transistor including a gate electrode, a gate insulating film containing nitrogen, and a channel region in a microcrystalline semiconductor film, including the steps of forming an amorphous semiconductor film over the microcrystalline semiconductor film after the microcrystalline semiconductor film is formed over the gate insulating film; performing plasma treatment in which the amorphous semiconductor film is exposed to plasma in an oxidizing gas atmosphere containing hydrogen and an oxidizing gas containing an oxygen atom; forming an insulating film over the amorphous semiconductor film; and forming a back gate electrode over the insulating film, in which Formula (6) and Formula (7), preferably Formula (7) and Formula (8), further preferably Formula (7) and Formula (9), still further preferably Formula (7) and Formula (10) are satisfied, where the amount of hydrogen and the amount of the oxidizing gas in the oxidizing gas atmosphere are c and d, respectively.

$$c/d \geq 2 \tag{6}$$

$$d > 0 \tag{7}$$

$$c/d > 2 \tag{8}$$

$$c/d \geq 3 \tag{9}$$

$$c/d \geq 4 \tag{10}$$

Further, in an embodiment of the present invention, it is preferable that the oxidizing gas include at least one of oxygen, $NO_2$, and $N_2O$.

An embodiment of the present invention is a plasma oxidation treatment method in which an insulating film or a semiconductor film is exposed to plasma in an oxidizing gas atmosphere containing hydrogen and an oxidizing gas containing an oxygen atom, in which Formula (11) and Formula (12), preferably Formula (12) and Formula (13), further preferably Formula (12) and Formula (14), still further preferably Formula (12) and Formula (15) are satisfied, where the amount of hydrogen and the amount of the oxidizing gas in the oxidizing gas atmosphere are e and f, respectively.

$$e/f \geq 2 \tag{11}$$

$$f > 0 \tag{12}$$

$$e/f > 2 \tag{13}$$

$$e/f \geq 3 \tag{14}$$

$$e/f \geq 4 \tag{15}$$

Further, in an embodiment of the present invention, it is preferable that the oxidizing gas include at least one of oxygen, $NO_2$, and $N_2O$.

With an embodiment of the present invention, a degradation of characteristics of a thin film transistor can be suppressed by performing plasma oxidation treatment on a gate insulating film containing nitrogen. Further, with an embodiment of the present invention, a degradation of characteristics of a thin film transistor can be suppressed by performing plasma oxidation treatment on a back channel side of a semiconductor film. Furthermore, with an embodiment of the present invention, a plasma oxidation treatment method with improved oxidizing power can be provided.

DETAILED DESCRIPTION OF THE INVENTION

Hereinafter, embodiments of the present invention will be described in detail with reference to the drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

[Embodiment 1]

In this embodiment, a method for manufacturing a thin film transistor formed in a semiconductor device that is an embodiment of the present invention will be described with reference to FIGS. 1A to 1D, FIGS. 2A and 2B, and FIGS. 3A to 3C. Note that an n-channel thin film transistor has a higher carrier mobility than a p-channel thin film transistor. In this embodiment, a method for manufacturing an n-channel thin film transistor will be described.

Figure 1A:
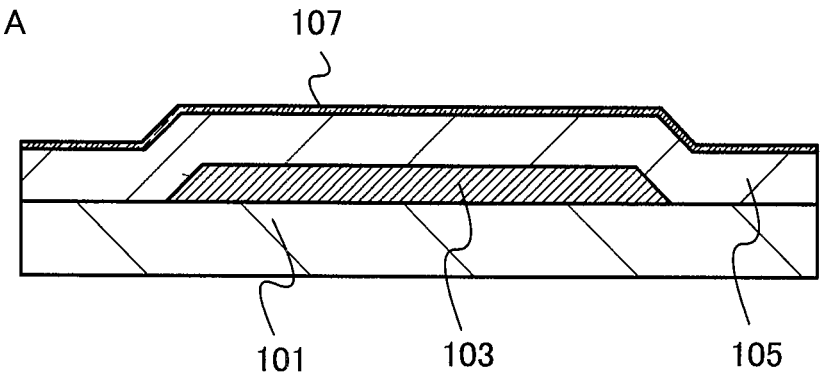
FIGS. 1A to 1D are cross-sectional views illustrating a method for manufacturing a semiconductor device according to an embodiment of the present invention.

As illustrated in FIG. 1A, a gate electrode 103 is formed over a substrate 101. Next, a gate insulating film 105 which covers the gate electrode 103 (hereinafter also referred to as "first gate electrode") and contains nitrogen is formed. Then, plasma treatment is performed, in which a surface of the gate insulating film 105 is exposed to plasma in an oxidizing gas atmosphere containing hydrogen and oxygen. Then, a first microcrystalline silicon film 107 is formed over the gate insulating film 105. It is preferable that the plasma oxidation treatment and the formation of the first microcrystalline silicon film 107 be successively performed using a plasma CVD apparatus, whereby the surface of the gate insulating film 105 can be prevented from being contaminated.

In the plasma treatment on the gate insulating film 105, assuming that the amount of hydrogen and the amount of oxygen in the oxidizing gas atmosphere are a and b, respectively, Formula (1) and Formula (2), preferably Formula (2)

and Formula (3), further preferably Formula (2) and Formula (4), still further preferably Formula (2) and Formula (5) are satisfied. Accordingly, the oxidizing power of the plasma treatment can be drastically improved; as a result, the plasma oxidation treatment can be performed in a shorter time.

$$a/b \geq 2 \quad (1)$$

$$b > 0 \quad (2)$$

$$a/b > 2 \quad (3)$$

$$a/b \geq 3 \quad (4)$$

$$a/b \geq 4 \quad (5)$$

By performing plasma oxidation treatment in the above-described manner, in which the surface of the gate insulating film 105 is exposed to plasma in the oxidizing gas atmosphere, a negative shift of the threshold voltage of the thin film transistor can be suppressed. Note that with such plasma oxidation treatment, a normally-off thin film transistor can be manufactured.

In this specification, an n-channel thin film transistor whose value of the threshold voltage is positive is defined as a normally-off thin film transistor. A p-channel thin film transistor whose value of the threshold voltage is negative is defined as a normally-off thin film transistor. Further, an n-channel thin film transistor whose value of the threshold voltage is negative is defined as a normally-on thin film transistor. Furthermore, a p-channel thin film transistor whose value of the threshold voltage is positive is defined as a normally-on thin film transistor.

As the substrate 101, a glass substrate, a ceramic substrate, or the like can be used. Note that there is no limitation on the size of the substrate 101. For example, any of glass substrates of the 3rd to 10th generations which are often used in the field of the above flat panel display can be used.

The gate electrode 103 can be formed in the following manner: a conductive film is formed over the substrate 101 by a sputtering method or a vacuum evaporation method using any metal material of Mo, Ti, Cr, Ta, W, Al, Cu, Nd, Sc, or Ni; a mask is formed over the conductive film by a photolithography method; and the conductive film is etched using the mask. In order to improve adhesion between the gate electrode 103 and the substrate 101, a nitride film of any of the above-described metal materials may be provided between the substrate 101 and the gate electrode 103. In this embodiment, a conductive film is formed over the substrate 101 and etched using a resist mask formed by a photolithography method.

Note that side surfaces of the gate electrode 103 are preferably tapered, in order to prevent an insulating film, a silicon film, and a wiring formed over the gate electrode 103 in later steps from being cut at a step portion of the gate electrode 103. In order to taper the side surfaces of the gate electrode 103, etching may be performed while the resist mask is made to recede.

The gate insulating film 105 can be formed as a single layer or a stacked layer using a silicon nitride film, a silicon nitride oxide film, and/or a silicon oxynitride film by a CVD method.

The first microcrystalline silicon film 107 includes mixed phase grains. It is preferable that the density of the mixed phase grains (existing percentage of the mixed phase grains in a plane) be low, the uniformity of grain sizes of the mixed phase grains be high, and the crystallinity of the mixed phase grains be high. Therefore, the first microcrystalline silicon film 107 may have a space between the adjacent mixed phase grains without the adjacent mixed phase grains being in contact with each other. The thickness of the first microcrystalline silicon film 107 is preferably greater than or equal to 1 nm and less than or equal to 10 nm. In a region having the space between the adjacent mixed phase grains without the adjacent mixed phase grains being in contact with each other, the smallest height of the mixed phase grains which are not in contact with each other is preferably 1 nm or more and the largest height of the mixed phase grains which are not in contact with each other is preferably 10 nm or less. Note that the mixed phase grains each include an amorphous silicon region and a plurality of silicon crystallites that are microcrystals regarded as single crystals of silicon. In some cases, the mixed phase grains may include a twin crystal.

The first microcrystalline silicon film 107 is formed in a treatment chamber of a plasma CVD apparatus, using plasma generated by glow discharge with the use of a mixture of a deposition gas containing silicon and hydrogen as a source gas, under a first condition which enables mixed phase grains serving as nuclei to be formed in the state that the density of the mixed phase grains is low and the crystallinity of the mixed phase grains is high. Alternatively, the first microcrystalline silicon film 107 is formed using plasma generated by glow discharge with the use of a mixture of a deposition gas containing silicon, hydrogen, and a rare gas such as helium, neon, or krypton. Here, the microcrystalline silicon is formed under the first condition in which the pressure inside the treatment chamber is higher than or equal to 67 Pa and lower than or equal to 50000 Pa (higher than or equal to 0.5 Torr and lower than or equal to 375 Torr).

The supplying method of the source gas under the first condition is such a method that a gas obtained by diluting the deposition gas containing silicon by setting the flow rate of hydrogen to be greater than or equal to 50 times and less than or equal to 1000 times that of the deposition gas is supplied. The deposition temperature is preferably from room temperature to 300° C., and further preferably 150° C. to 280° C. The distance between an upper electrode and a lower electrode of the plasma CVD apparatus may be set to a distance which enables generation of plasma.

As typical examples of the deposition gas containing silicon, there are $SiH_4$ and $Si_2H_6$.

In the case where a rare gas such as helium, argon, neon, krypton, or xenon is mixed into the source gas of the first microcrystalline silicon film 107, the deposition rate of the first microcrystalline silicon film 107 is increased. Moreover, in the case where the deposition rate is increased, the amount of impurities mixed in the first microcrystalline silicon film 107 is reduced, so that the crystallinity of the first microcrystalline silicon film 107 can be improved. Thus, the on-state current and field-effect mobility of the thin film transistor are increased and throughput of the thin film transistor can also be increased.

In the glow discharge at the time of forming the first microcrystalline silicon film 107, the plasma is generated by application of high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. It is preferable to determine the power for generating the plasma as appropriate in accordance with the ratio of the flow rate of hydrogen to the flow rate of the deposition gas containing silicon.

Figure 1B:
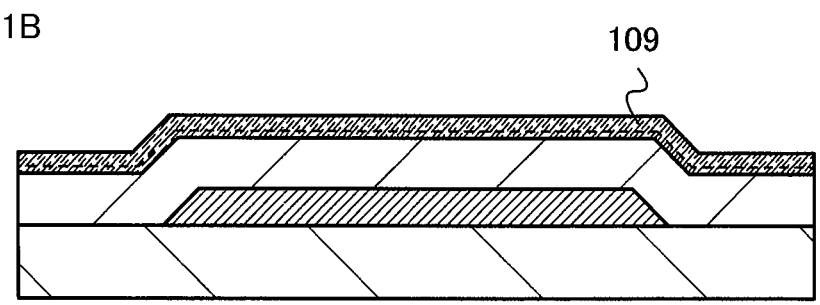

Next, as illustrated in FIG. 1B, a second microcrystalline silicon film 109 is formed over the first microcrystalline silicon film 107. The second microcrystalline silicon film 109 includes mixed phase grains each including silicon crystallites and amorphous silicon, and is preferably formed under a condition which enables the second microcrystalline silicon film 109 to fill the space between the mixed phase grains of the first microcrystalline silicon film 107 and also promotes crystal growth. Note that the thickness of the second microcrystalline silicon film 109 is preferably greater than or equal to 30 nm and less than or equal to 100 nm.

The second microcrystalline silicon film 109 is formed in a treatment chamber of the plasma CVD apparatus, using plasma generated by glow discharge with the use of a mixture of a deposition gas containing silicon and hydrogen as a source gas under the second condition. Alternatively, the second microcrystalline silicon film 109 may be formed using plasma generated by glow discharge with the use of a mixture of a deposition gas containing silicon, hydrogen, and a rare gas such as helium, neon, or krypton under the second condition. Here, the microcrystalline silicon is formed under the second condition in which the deposition gas containing silicon is diluted by setting the flow rate of hydrogen to be greater than or equal to 100 times and less than or equal to 3000 times that of the deposition gas and the pressure inside the treatment chamber is set to be higher than or equal to 1333 Pa and lower than or equal to 50000 Pa (higher than or equal to 10 Torr and lower than or equal to 375 Torr). As a result, the ratio of a crystalline region to the amorphous semiconductor region is increased in the second microcrystalline silicon film 109, whereby the crystallinity is increased. The deposition temperature at this time is preferably from room temperature to 300° C., and further preferably 150° C. to 280° C. The distance between an upper electrode and a lower electrode of the plasma CVD apparatus is set to a distance which enables generation of plasma. By newly generating the mixed phase grains of the second microcrystalline silicon film in the space between the mixed phase grains of the first microcrystalline silicon film, the size of the mixed phase grains is reduced. Therefore, it is preferable that the frequency of generation of the mixed phase grains of the second microcrystalline silicon film be lower than that of the mixed phase grains of the first microcrystalline silicon film.

In the case where a rare gas such as helium, argon, neon, krypton, or xenon is mixed into the source gas of the second microcrystalline silicon film 109, the crystallinity of the second microcrystalline silicon film 109 can be increased in a manner similar to that of the first microcrystalline silicon film 107. Accordingly, the on-state current and the field-effect mobility of the thin film transistor are increased and the throughput of the thin film transistor can also be increased.

The condition for generating plasma by glow discharge at the time of forming the first microcrystalline silicon film 107 can be employed as appropriate for formation of the second microcrystalline silicon film 109. In the case where the condition for generating plasma by glow discharge at the time of forming the first microcrystalline silicon film 107 and that at the time of forming the second microcrystalline silicon film 109 are the same, throughput can be increased; however, they may be different from each other.

Microcrystalline silicon is a semiconductor having an intermediate structure between an amorphous structure and a crystalline structure (including single crystal and polycrystal). Microcrystalline silicon is a semiconductor having a third state that is stable in terms of free energy and is a crystalline semiconductor having short-range order and lattice distortion, in which columnar or needle-like crystals having a grain size of 2 nm to 200 nm, preferably 10 nm to 80 nm, further preferably 20 nm to 50 nm, still further preferably 25 nm to 33 nm have grown in a direction normal to the substrate surface. Therefore, there are some cases in which a crystal grain boundary is formed at the interface between the columnar or needle-like crystals. Note that the mixed phase grain size here means a maximum diameter of a mixed phase grain in a plane parallel to the substrate surface.

The Raman spectrum of microcrystalline silicon is shifted to a smaller wavenumber region than 520 $cm^{-1}$ which represents single crystal silicon. That is, the peak of the Raman spectrum of the microcrystalline silicon exists between 520 $cm^{-1}$ which represents single crystal silicon and 480 $cm^{-1}$ which represents amorphous silicon. Microcrystalline silicon includes at least 1 at. % or more of hydrogen or halogen to terminate a dangling bond. Moreover, the microcrystalline silicon may contain a rare gas element such as helium, argon, krypton, or neon to further promote lattice distortion, so that stability is increased and favorable microcrystalline silicon can be obtained. Such microcrystalline silicon is disclosed in, for example, U.S. Pat. No. 4,409,134.

In this embodiment, by reducing the space between the mixed phase grains, a microcrystalline silicon film having high crystallinity can be formed.

Further, by employing a two-step film formation method in which the second microcrystalline silicon film 109 is stacked over the first microcrystalline silicon film 107, the space between the mixed phase grains can be effectively filled; as a result, a microcrystalline silicon film having large grain size and high crystallinity as well as keeping high film density can be formed. As a result, the field-effect mobility can be increased, and a device with more excellent electrical characteristics can be realized.

In this embodiment, the two-step film formation method in which the second microcrystalline silicon film 109 is stacked over the first microcrystalline silicon film 107 is employed; however, the two-step film formation method is not a requisite and the microcrystalline silicon film may be formed using a one-step film formation method or a plural-step film formation method.

Alternatively, a cycle flow process can be employed for at least one of the supplying method of the source gas under the first condition and the supplying method of the source gas under the second condition in this embodiment. A case in which a cycle flow process is employed for the supplying method of the source gas under the first condition will be described below. The following description can also apply to a case in which a cycle flow process is employed for the supplying method of the source gas under the second condition.

The supplying method of the source gas under the first condition is as follows: supply of a gas obtained by diluting the deposition gas containing silicon by setting the flow rate of hydrogen to be greater than or equal to 50 times and less than or equal to 1000 times that of the deposition gas and supply of a gas in which the flow rate of the deposition gas is less than that of the deposition gas in the gas supplied as above and is set so as to primarily cause etching of silicon deposited over the gate insulating film 105 rather than deposition of silicon over the gate insulating film 105 are alternately performed. Note that the flow rate of the deposition gas which primarily causes the etching may be 0 sccm. The deposition temperature at this time is preferably from room temperature to 300° C., and further preferably 150° C. to 280° C. The distance between an upper electrode and a lower electrode of the plasma CVD apparatus is set to a distance which enables generation of plasma.

The supplying method of the source gas under the first condition is a method in which the flow rate of the deposition gas containing silicon is changed to alternate between high and low flow rates during generation of plasma by glow discharge. During the period in which the deposition gas is supplied at a low flow rate, etching of silicon deposited over the gate insulating film 105 primarily occurs rather than deposition of silicon over the gate insulating film 105. In contrast, during the period in which the deposition gas is supplied at a high flow rate, deposition of silicon over the gate insulating film 105 primarily occurs rather than etching of silicon deposited over the gate insulating film 105. Thus, an amorphous silicon component is selectively etched by the hydrogen gas during the period in which the deposition gas is supplied at a low flow rate, and the mixed phase grains grow during the period in which the deposition gas is supplied at a high flow rate. By the repetition of the etching and the growth, the first microcrystalline silicon film including a small amount of amorphous silicon component and having high crystallinity can be obtained.

The supply of the deposition gas at a high flow rate enlarges the mixed phase grains that have already been deposited over the gate insulating film 105 and produces new mixed phase grains over the gate insulating film 105. The supply of the deposition gas at a low flow rate causes etching and removal of the small mixed phase grains that have just been generated but leaves the relatively large mixed phase grains that have already been deposited over the gate insulating film 105. By the repetition of the growth and the etching, the mixed phase grains with small grain sizes are reduced. Accordingly, the first microcrystalline silicon film including many mixed phase grains having large and highly uniform grain sizes can be obtained.

With the first condition in this manner, crystal growth is promoted and the crystallinity of the mixed phase grains is increased. That is, the size of the crystallites included in the mixed phase grains is increased. Further, the space is formed between the adjacent mixed phase grains, so that the density of mixed phase grains is lowered.

The use of the above-described supplying method of the source gas in which the flow rate of the deposition gas is changed to alternate between high and low flow rates makes the grain size of the mixed phase grains deposited over the gate insulating film 105 large, the uniformity of the mixed phase grains high, and the crystallinity of the mixed phase grains high as compared to the case of supplying the deposition gas at a constant flow rate without the flow rate thereof changed.

As described above, at the time of forming the first microcrystalline silicon film 107, the use of the supplying method of the source gas in which the flow rate of the deposition gas is changed to alternate between high and low flow rates makes the grain size of the mixed phase grains deposited over the gate insulating film 105 large and the crystallinity of the mixed phase grains high as compared to the case of supplying the deposition gas at a constant flow rate without the flow rate thereof changed. Further, by employing the two-step film formation method in which the second microcrystalline silicon film 109 is stacked over the first microcrystalline silicon film 107, the space between the mixed phase grains can be effectively filled; as a result, a microcrystalline silicon film having large grain size and high crystallinity as well as keeping high film density can be formed. As a result, the field-effect mobility can be increased, and a device with more excellent electrical characteristics can be realized.

Figure 1C:
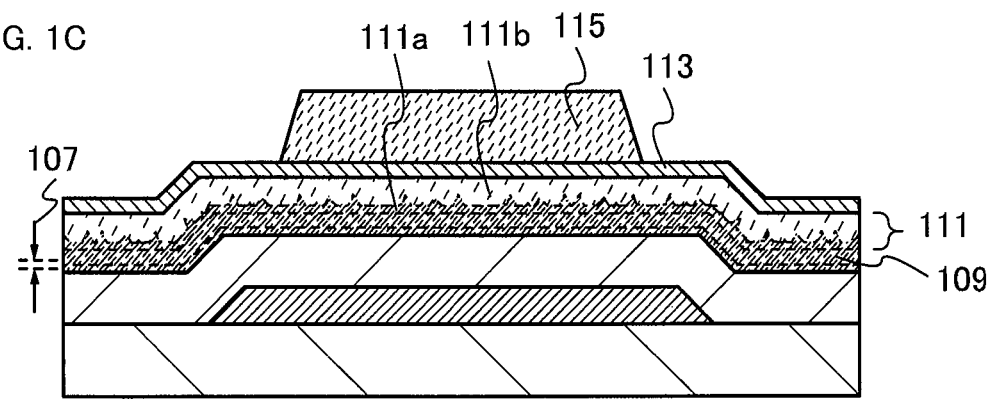

Next, as illustrated in FIG. 1C, a silicon film 111 is formed over the second microcrystalline silicon film 109. The silicon film 111 includes a microcrystalline silicon region 111*a* and an amorphous silicon region 111*b*. Then, an impurity silicon film 113 is formed over the silicon film 111, and a resist mask 115 is formed over the impurity silicon film 113.

The silicon film 111 including the microcrystalline silicon region 111*a* and the amorphous silicon region 111*b* can be formed under a condition which causes partial crystal growth using the second microcrystalline silicon film 109 as a seed crystal (a condition by which the crystal growth is suppressed).

The silicon film 111 is formed in a treatment chamber of the plasma CVD apparatus, using plasma generated by glow discharge with the use of a mixture of a deposition gas containing silicon, hydrogen, and a gas containing nitrogen. As examples of the gas containing nitrogen, there are ammonia, nitrogen, nitrogen fluoride, and nitrogen chloride. Generation of plasma by glow discharge can be performed in a manner similar to that of the first microcrystalline silicon film 107.

In that case, the flow rate ratio of hydrogen to the deposition gas containing silicon is set to a ratio for forming a microcrystalline silicon film in a manner similar to that in forming the first microcrystalline silicon film 107 or the second microcrystalline silicon film 109, and the gas containing nitrogen is used as a source gas, whereby crystal growth can be suppressed as compared to the deposition conditions for the first microcrystalline silicon film 107 and the second microcrystalline silicon film 109. Specifically, at an early stage of deposition of the silicon film 111, the gas containing nitrogen included in the source gas partly suppresses the crystal growth, so that a conical microcrystalline silicon region or a pyramidal microcrystalline silicon region grows and an amorphous silicon region is formed. Further, at a middle stage or a later stage of the deposition, crystal growth of the conical or pyramidal microcrystalline silicon region stops, and only an amorphous silicon region is deposited. Accordingly, in the silicon film 111, the microcrystalline silicon region 111*a* and the amorphous silicon region 111*b* which is formed using a well-ordered silicon film having fewer defects and a steep tail of a level at a valence band edge, can be formed.

Here, a typical example of a condition for forming the silicon film 111 is as follows: the flow rate of hydrogen is 10 times to 2000 times, preferably 10 times to 200 times that of the deposition gas containing silicon. Note that in a typical example of a condition for forming a normal amorphous silicon film, the flow rate of hydrogen is 0 times to 5 times that of the deposition gas containing silicon.

In the case where a rare gas such as helium, neon, argon, xenon, or krypton is introduced into the source gas of the silicon film 111, the deposition rate can be increased.

It is preferable that the silicon film 111 have a thickness of 50 nm to 350 nm, further preferably a thickness of 120 nm to 250 nm.

Figure 2A:
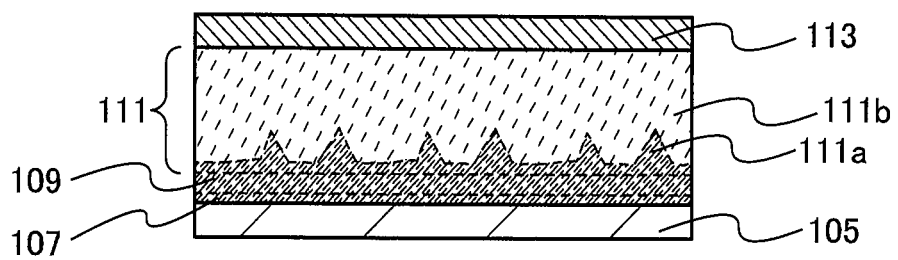
FIGS. 2A and 2B are cross-sectional views illustrating methods for manufacturing a semiconductor device according to an embodiment of the present invention.
Figure 2B:
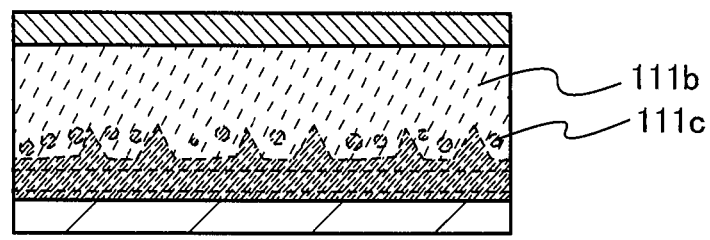

FIGS. 2A and 2B are enlarged views of the portion between the gate insulating film 105 and the impurity silicon film 113 illustrated in FIG. 1C.

As illustrated in FIG. 2A, the microcrystalline silicon region 111*a* in the silicon film 111 has a projection and a depression. The projection has a conical or pyramidal shape whose width decreases from the second microcrystalline silicon film 109 side toward the amorphous silicon region 111*b* side (a tip of the projection has an acute angle). Alternatively, the microcrystalline silicon region 111*a* may have a projecting (inverted conical or pyramidal) shape whose width increases from the second microcrystalline silicon film 109 side toward the amorphous semiconductor region 111*b* side.

By setting the thickness of the first microcrystalline silicon film 107, the second microcrystalline silicon film 109, and the microcrystalline silicon region 111*a*, that is, the distance from the interface between the first microcrystalline silicon film 107 and the gate insulating film 105 to the tip of the projection of the microcrystalline silicon region 111a to 5 nm or more and 150 nm or less, the on-state current of the thin film transistor can be increased.

Further, in order to improve the crystallinity of the microcrystalline silicon region 111a, it is preferable that the concentration of oxygen contained in the silicon film 111, which is measured by secondary ion mass spectrometry, be less than $1 \times 10^{18}$ atoms/cm$^3$.

The amorphous silicon region 111b is preferably formed of an amorphous semiconductor containing nitrogen. The nitrogen of the amorphous semiconductor containing nitrogen may exist, for example, as an NH group or an NH$_2$ group. As the amorphous semiconductor, amorphous silicon can be used.

Amorphous silicon containing nitrogen is a semiconductor having lower energy at an Urbach edge that is measured by a constant photocurrent method (CPM) or photoluminescence spectroscopy and a smaller amount of defect absorption spectrum, as compared to a conventional amorphous semiconductor. In other words, as compared to the conventional amorphous semiconductor, the amorphous silicon containing nitrogen is a well-ordered semiconductor which has few defects and whose tail of a level at a valence band edge is steep. Since the amorphous silicon containing nitrogen has a steep tail of a level at a valence band edge, the band gap is wide and tunnel current does not flow easily. Therefore, when the amorphous silicon containing nitrogen is provided between the microcrystalline silicon region 111a and the impurity silicon film 113, the off-state current of the thin film transistor can be reduced. In addition, by provision of the amorphous silicon containing nitrogen, the on-state current and the field-effect mobility can be increased.

Further, the peak of a spectrum of the amorphous silicon containing nitrogen that is measured by low-temperature photoluminescence spectroscopy is higher than or equal to 1.31 eV and lower than or equal to 1.39 eV. Note that the peak of a spectrum of microcrystalline silicon, which is measured by low-temperature photoluminescence spectroscopy is higher than or equal to 0.98 eV and lower than or equal to 1.02 eV. Accordingly, the amorphous silicon containing nitrogen is different from microcrystalline silicon.

The microcrystalline silicon region 111a, as well as the amorphous silicon region 111b, may include an NH group or an NH$_2$ group.

Further, as illustrated in FIG. 2B, a silicon crystal grain 111c whose grain size is greater than or equal to 1 nm and less than or equal to 10 nm, preferably greater than or equal to 1 nm and less than or equal to 5 nm may be included in the amorphous silicon region 111b, so that the on-state current and the filed-effect mobility can be further increased.

The microcrystalline silicon having a projecting (conical or pyramidal) shape whose width decreases from the second microcrystalline silicon film 109 toward the amorphous silicon region 111b is formed in the following manner: after the second microcrystalline silicon film is formed under the deposition condition for microcrystalline silicon, crystal growth is caused on such a condition that the crystal growth is less induced and amorphous silicon is deposited.

Since the microcrystalline silicon region 111a in the silicon film 111 has the conical or pyramidal shape or the inverted conical or pyramidal shape, resistance in a vertical direction (film thickness direction) of when voltage is applied between a source and drain electrodes in an on state, i.e., the resistance of the silicon film 111 can be lowered. Further, tunnel current does not easily flow because amorphous silicon containing nitrogen is provided between the microcrystalline silicon region 111a and the impurity silicon film 113. Amorphous silicon containing nitrogen is a well-ordered semiconductor having few defects and a steep tail of a level at a valence band edge. Thus, in the thin film transistor described in this embodiment, the on-state current and the field-effect mobility can be increased and the off-state current can be reduced.

The impurity silicon film 113 is formed using amorphous silicon to which phosphorus is added, microcrystalline silicon to which phosphorus is added, or the like. A structure in which amorphous silicon to which phosphorus is added and microcrystalline silicon to which phosphorus is added are stacked can also be employed. In the case of forming a p-channel thin film transistor as a thin film transistor, the impurity silicon film 113 is formed using microcrystalline silicon to which boron is added, amorphous silicon to which boron is added, or the like.

The impurity silicon film 113 is formed in a treatment chamber of the plasma CVD apparatus, using plasma generated by glow discharge with the use of a mixture of a deposition gas containing silicon, hydrogen, and phosphine (diluted with hydrogen or silane) as a source gas. In the case of manufacturing a p-channel thin film transistor, the impurity silicon film 113 may be formed using plasma generated by glow discharge using diborane instead of phosphine.

The resist mask 115 can be formed by a photolithography step.

Figure 1D:
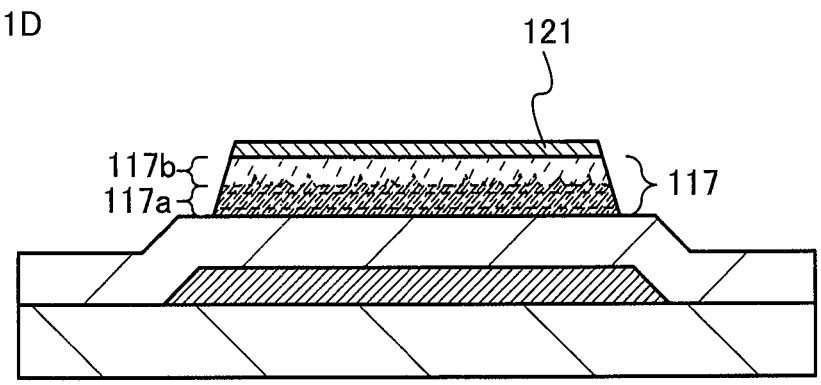

Next, as illustrated in FIG. 1D, the first microcrystalline silicon film 107, the second microcrystalline silicon film 109, the silicon film 111, and the impurity silicon film 113 are etched using the resist mask 115. By this step, the first microcrystalline silicon film 107, the second microcrystalline silicon film 109, the silicon film 111, and the impurity silicon film 113 are divided into elements, so that a silicon stacked body 117 and an impurity silicon film 121 are formed. The silicon stacked body 117 is formed including part of the first microcrystalline silicon film 107, part of the second microcrystalline silicon film 109, and part of the silicon film 111. The silicon stacked body 117 is constituted of a microcrystalline silicon region 117a which includes part of the first microcrystalline silicon film 107, part of the second microcrystalline silicon film 109, and part of the microcrystalline silicon region of the silicon film 111 and an amorphous silicon region 117b which includes part of the amorphous silicon region of the silicon film 111. Then, the resist mask 115 is removed.

Figure 3A:
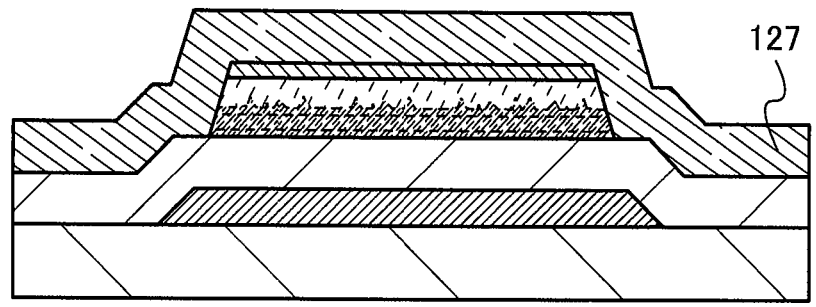
FIGS. 3A to 3C are cross-sectional views illustrating a method for manufacturing a semiconductor device according to an embodiment of the present invention.

Then, as illustrated in FIG. 3A, a conductive film 127 is formed over the impurity silicon film 121. The conductive film 127 is formed by a CVD method, a sputtering method, or a vacuum evaporation method.

Figure 3B:
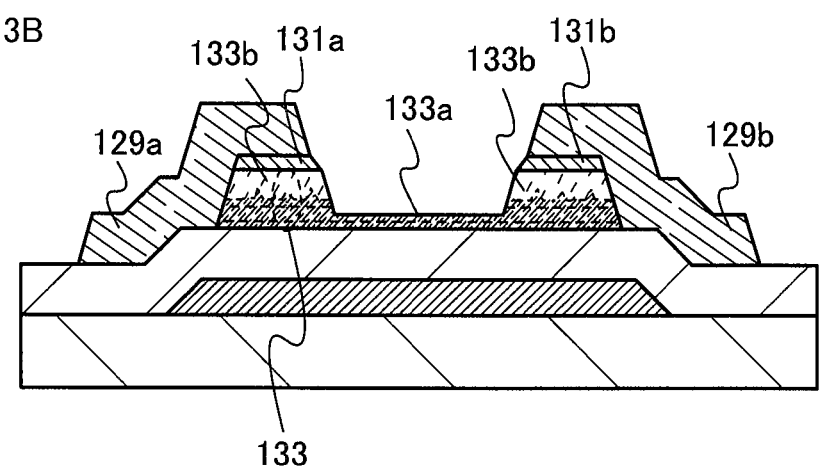

Next, as illustrated in FIG. 3B, wirings 129a and 129b functioning as a source electrode and a drain electrode are formed by forming a resist mask (not illustrated) by a photolithography step and etching the conductive film 127 with the use of the resist mask. The etching of the conductive film 127 may be either dry etching or wet etching. Note that one of the wirings 129a and 129b functions as a signal line as well as a source electrode or a drain electrode. However, without limitation thereto, a signal line may be provided separately from the source and drain electrodes.

Next, the impurity silicon film 121 and the silicon stacked body 117 are partly etched, so that a pair of impurity silicon films 131a and 131b functioning as a source and drain regions are formed. A silicon stacked body 133 including a microcrystalline silicon region 133a and a pair of amorphous silicon regions 133b is formed. At this time, the silicon stacked body 117 is etched so as to expose the microcrystalline silicon region 133a, so that the silicon stacked body 133 is formed in which the microcrystalline silicon region 133a and the amorphous silicon regions 133b are stacked in regions covered with the wirings 129a and 129b and the microcrystalline silicon region 133a is exposed in a region covered with neither the wiring 129a nor the wiring 129b and overlapping with the gate electrode.

Next, dry etching may be performed on the silicon stacked body 133. As the condition for the dry etching, a condition by which the exposed microcrystalline silicon region 133a and the exposed amorphous silicon regions 133b are not damaged and in which the etching rate of the microcrystalline silicon region 133a and the amorphous silicon regions 133b is low is used. As an etching gas, $Cl_2$, $CF_4$, $N_2$, or the like is typically used.

Through the above-described process, a single-gate thin film transistor can be manufactured. A single-gate thin film transistor with low off-state current, high on-state current, and high field-effect mobility can be manufactured with high productivity.

Note that in this embodiment, a thin film transistor whose gate electrode is located below a channel region has been described as a semiconductor device according to an embodiment of the present invention; however, the present invention may also be applied to a dual-gate thin film transistor whose back gate electrode is located above a channel region as a semiconductor device according to an embodiment of the present invention. In this case, the dual-gate thin film transistor can be manufactured through the following process after the above-described process.

Figure 3C:
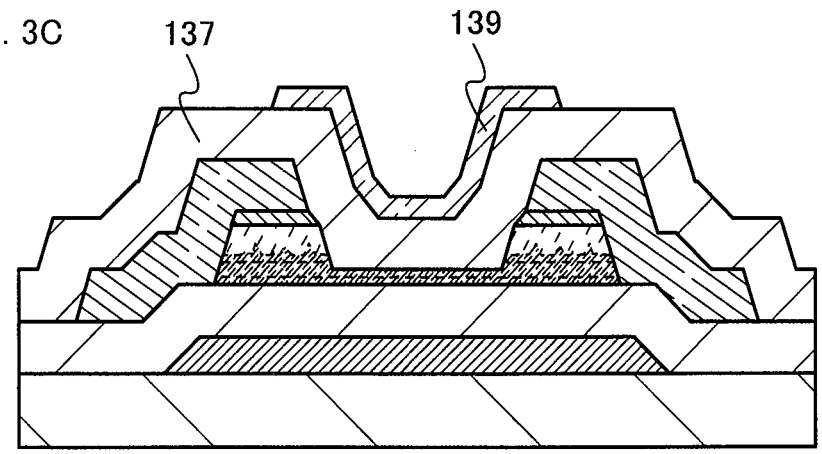

Plasma treatment is performed in which surfaces of the microcrystalline silicon region 133a and the amorphous silicon regions 133b illustrated in FIG. 3B are exposed to plasma in an oxidizing gas atmosphere containing hydrogen and oxygen, and then as illustrated in FIG. 3C, an insulating film 137 is formed over the silicon stacked body 133 and the wirings 129a and 129b. The insulating film 137 can be formed in a manner similar to that for the gate insulating film 105. It is preferable that the plasma oxidation treatment and the formation of the insulating film 137 be successively performed using a plasma CVD apparatus, whereby contaminations of the surfaces of the microcrystalline silicon region 133a and the amorphous silicon regions 133b, for example, a back channel surface can be suppressed.

In the plasma treatment on the microcrystalline silicon region 133a and the amorphous silicon regions 133b, assuming that the amount of hydrogen and the amount of oxygen in the oxidizing gas atmosphere are c and d, respectively, Formula (6) and Formula (7), preferably Formula (7) and Formula (8), further preferably Formula (7) and Formula (9), still further preferably Formula (7) and Formula (10) are satisfied. Accordingly, the oxidizing power of the plasma treatment can be drastically improved; as a result, the plasma oxidation treatment can be performed in a shorter time.

$$c/d \geq 2 \quad (6)$$

$$d > 0 \quad (7)$$

$$c/d > 2 \quad (8)$$

$$c/d \geq 3 \quad (9)$$

$$c/d \geq 4 \quad (10)$$

Next, an opening (not illustrated) is formed in the insulating film 137 with the use of a resist mask formed by a photolithography step. Then, a back gate electrode 139 is formed over the insulating film 137 (see FIG. 3C). Through the above-described process, a dual-gate thin film transistor can be manufactured.

The back gate electrode 139 can be formed in a manner similar to that of the wirings 129a and 129b. Alternatively, the back gate electrode 139 can be formed using a light-transmitting conductive material.

The back gate electrode 139 can be formed in parallel to the gate electrode 103. In this case, the potential applied to the back gate electrode 139 and the potential applied to the gate electrode 103 can each be controlled independently. Thus, the threshold voltage of the thin film transistor can be controlled. Further, regions in which carriers flow, that is, channel regions, are formed on the gate insulating film 105 side and on the insulating film 137 side in the microcrystalline silicon region; thus, the on-state current of the thin film transistor can be increased.

The back gate electrode 139 can be connected to the gate electrode 103. That is, the gate electrode 103 and the back gate electrode 139 can be connected through an opening (not illustrated) formed in the gate insulating film 105 and the insulating film 137. In this case, the potential applied to the back gate electrode 139 and the potential applied to the gate electrode 103 are equal. As a result, regions in which carriers flow, that is, channel regions are formed on the gate insulating film 105 side and on the insulating film 137 side in the microcrystalline silicon region; thus, the on-state current of the thin film transistor can be increased.

Further alternatively, the back gate electrode 139 is not necessarily connected to the gate electrode 103 and may be in a floating state. In that case, channel regions are formed on the gate insulating film 105 side and on the insulating film 137 side in the microcrystalline silicon region without a potential applied to the back gate electrode 139; thus, the on-state current of the thin film transistor can be increased.

Further, the back gate electrode 139 may overlap with the wirings 129a and 129b with the insulating film 137 provided therebetween.

Through the above-described process, a single-gate thin film transistor and a dual-gate thin film transistor having high on-state current, high field-effect mobility, low off-state current, and small variation can be manufactured. In the case where, after exposing a gate insulating film to oxygen plasma, a microcrystalline silicon film as in Embodiment 1 is formed for a channel region, a thin film transistor which is normally off as well as having the above-described effects can be manufactured.

According to this embodiment, the surface of the gate insulating film 105 can be oxidized by being subjected to plasma treatment in which the surface of the gate insulating film 105 is exposed to plasma in an oxidizing gas atmosphere containing hydrogen and oxygen even in the case of using an insulating film containing nitrogen as the gate insulating film 105. Accordingly, crystallization of a microcrystalline silicon film can be prevented from being inhibited by nitrogen in the gate insulating film 105 at the time of forming the microcrystalline silicon film over the gate insulating film 105, which can prevent formation of an amorphous silicon region (so-called incubation layer) on the gate insulating film 105. Thus, degradation of characteristics of the thin film transistor can be suppressed.

According to this embodiment, even in the case where a portion placed on the back channel side in the microcrystalline silicon film is damaged by etching part of the impurity silicon film 121 and part of the silicon stacked body 117, the damaged portion in the microcrystalline silicon film can be oxidized by performing plasma treatment in which a surface of the microcrystalline silicon film is exposed to plasma in an oxidizing gas atmosphere containing hydrogen and oxygen. By forming an oxide film on the surface of the back channel in this manner, a degradation of characteristics of the thin film transistor can be suppressed.

[Embodiment 2]

This embodiment is the same as Embodiment 1 except the following points.

In Embodiment 1, plasma treatment in which the surface of the gate insulating film 105 illustrated in FIG. 1A is exposed to plasma in an oxidizing gas atmosphere containing hydrogen and oxygen is performed, while in this embodiment, plasma treatment with plasma in an oxidizing gas atmosphere containing hydrogen and $N_2O$ is performed.

In the plasma treatment on the gate insulating film 105, assuming that the amount of hydrogen and the amount of $N_2O$ in the oxidizing gas atmosphere are e and f, respectively, Formula (11) and Formula (12), preferably Formula (12) and Formula (13), further preferably Formula (12) and Formula (14), still further preferably Formula (12) and Formula (15) are satisfied. Accordingly, the oxidizing power of the plasma treatment can be drastically improved; as a result, the plasma oxidation treatment can be performed in a shorter time.

$$e/f \geq 2 \tag{11}$$

$$f > 0 \tag{12}$$

$$e/f > 2 \tag{13}$$

$$e/f \geq 3 \tag{14}$$

$$e/f \geq 4 \tag{15}$$

In Embodiment 1, plasma treatment in which the surfaces of the microcrystalline silicon region 133a and the amorphous silicon regions 133b illustrated in FIG. 3B are exposed to plasma in an oxidizing gas atmosphere containing hydrogen and oxygen is performed, while in this embodiment, plasma treatment with plasma in an oxidizing gas atmosphere containing hydrogen and $N_2O$ is performed.

In the plasma treatment on the microcrystalline silicon region 133a and the amorphous silicon regions 133b, assuming that the amount of hydrogen and the amount of $N_2O$ in the oxidizing gas atmosphere are g and h, respectively, Formula (16) and Formula (17), preferably Formula (17) and Formula (18), further preferably Formula (17) and Formula (19), still further preferably Formula (17) and Formula (20) are satisfied. Accordingly, the oxidizing power of the plasma treatment can be drastically improved; as a result, the plasma oxidation treatment can be performed in a shorter time.

$$g/h \geq 2 \tag{16}$$

$$h > 0 \tag{17}$$

$$g/h > 2 \tag{18}$$

$$g/h \geq 3 \tag{19}$$

$$g/h \geq 4 \tag{20}$$

Advantageous effects similar to those of Embodiment 1 can also be obtained in this embodiment.

[Embodiment 3]

Figure 4:
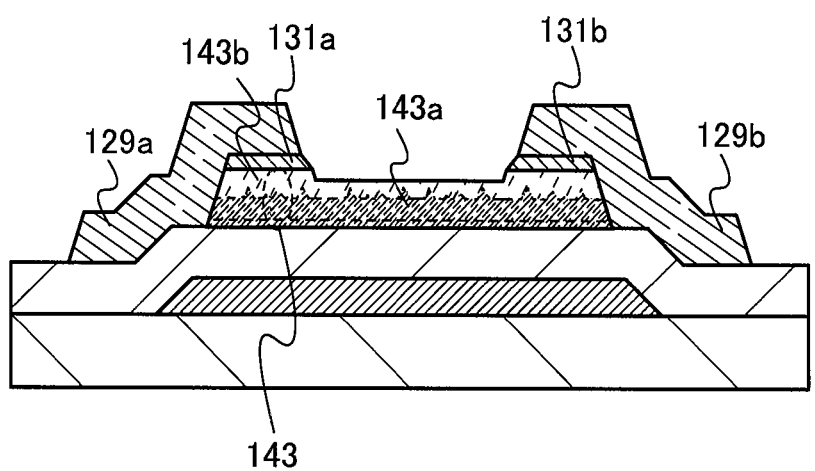
FIG. 4 is a cross-sectional view illustrating a method for manufacturing a thin film transistor formed in a semiconductor device of an embodiment of the present invention.

In this embodiment, a method for manufacturing a thin film transistor formed in a semiconductor device that is one embodiment of the present invention will be described with reference to FIG. 4. FIG. 4 illustrates a step corresponding to the step illustrated in FIG. 3B.

In a manner similar to that of Embodiment 1, a conductive film 127 is formed through the process of FIGS. 1A to 1D and FIG. 3A.

Then, as illustrated in FIG. 4, wirings 129a and 129b are formed and an impurity silicon film 121 and a silicon stacked body 117 are partly etched, so that a pair of impurity silicon films 131a and 131b serving as a source region and a drain region are formed in a manner similar to that of Embodiment 1. A silicon stacked body 143 including a microcrystalline silicon region 143a and an amorphous silicon region 143b is formed. At this time, the silicon stacked body 117 is etched so as to expose the amorphous silicon region 143b, so that the silicon stacked body 143 is formed in which the microcrystalline silicon region 143a and the amorphous silicon region 143b are stacked in regions covered with the wiring 129a or 129b and the microcrystalline silicon region 143a is not exposed and the amorphous silicon region 143b is exposed in a region covered with neither the wiring 129a nor the wiring 129b and overlapping with the gate electrode. Note that the etching amount of the silicon stacked body 117 is smaller than that in the case of FIG. 3B.

The subsequent process is similar to that of Embodiment 1. However, in Embodiment 1, plasma treatment in which the surface of the microcrystalline silicon region 133a illustrated in FIG. 3B is exposed to plasma in an oxidizing gas atmosphere containing hydrogen and oxygen is performed, which is different from this embodiment in which plasma treatment in which a surface of the amorphous silicon region 143b illustrated in FIG. 4 is exposed to plasma in an oxidizing gas atmosphere containing hydrogen and oxygen is performed.

Through the above-described process, a single-gate thin film transistor can be manufactured. Since the back channel side of the thin film transistor is amorphous, the off-state current can be reduced as compared to the thin film transistor illustrated in FIG. 3B.

Further in this embodiment, after the step illustrated in FIG. 4, a back gate electrode 139 may be formed over an insulating film 137 as in the step illustrated in FIG. 3C or may not be formed.

Advantageous effects similar to those of Embodiment 1 can be obtained in this embodiment.

[Embodiment 4]

This embodiment is the same as Embodiment 3 except the following points.

In Embodiment 3, plasma treatment in which the surface of the gate insulating film 105 illustrated in FIG. 1A is exposed to plasma in an oxidizing gas atmosphere containing hydrogen and oxygen is performed, while in this embodiment, plasma treatment with plasma in an oxidizing gas atmosphere containing hydrogen and $N_2O$ is performed.

In the plasma treatment on the gate insulating film 105, assuming that the amount of hydrogen and the amount of $N_2O$ in the oxidizing gas atmosphere are e and f, respectively, Formula (11) and Formula (12), preferably Formula (12) and Formula (13), further preferably Formula (12) and Formula (14), still further preferably Formula (12) and Formula (15) are satisfied. Accordingly, the oxidizing power of the plasma treatment can be drastically improved; as a result, the plasma oxidation treatment can be performed in a shorter time.

$$e/f \geq 2 \tag{11}$$

$$f > 0 \tag{12}$$

$$e/f > 2 \tag{13}$$

$$e/f \geq 3 \tag{14}$$

$$e/f \geq 4 \tag{15}$$

In Embodiment 3, plasma treatment in which the surface of the amorphous silicon region 143b illustrated in FIG. 4 is exposed to plasma in the oxidizing gas atmosphere containing hydrogen and oxygen is performed, while in this embodiment, plasma treatment with plasma in an oxidizing gas atmosphere containing hydrogen and $N_2O$ is performed.

In the plasma treatment on the amorphous silicon region 143b, assuming that the amount of hydrogen and the amount of $N_2O$ in the oxidizing gas atmosphere are g and h, respectively, Formula (16) and Formula (17), preferably Formula (17) and Formula (18), further preferably Formula (17) and Formula (19), still further preferably Formula (17) and Formula (20) are satisfied. Accordingly, the oxidizing power of the plasma treatment can be drastically improved; as a result, the plasma oxidation treatment can be performed in a shorter time.

$$g/h \geq 2 \quad (16)$$

$$h > 0 \quad (17)$$

$$g/h > 2 \quad (18)$$

$$g/h \geq 3 \quad (19)$$

$$g/h \geq 4 \quad (20)$$

Advantageous effects similar to those of Embodiment 3 can be obtained in this embodiment.

EXAMPLES

Example 1

In this example, an experiment was conducted on the plasma treatment in which the surface of the microcrystalline silicon film illustrated in FIG. 3B in Embodiment 1 was exposed to plasma in the oxidizing gas atmosphere containing hydrogen and oxygen. The method and results of the experiment will be described.

The method of the experiment was as follows. First, a Si wafer was subjected to treatment with HF for 90 seconds, so that an oxide film on a surface of the Si wafer was removed. Next, the Si wafer was introduced into a plasma CVD apparatus, and plasma treatment in which the surface of the Si wafer was exposed to plasma in an oxidizing gas atmosphere containing hydrogen and oxygen was performed with the plasma CVD apparatus, so that a silicon oxide film was formed on the Si wafer. The plasma treatment conditions at this time were such that parallel-plate electrodes were used for generating plasma, the gap between the electrodes was 15 mm, the high-frequency power supplied to the electrodes was 300 W or 600 W, the treatment pressure was 1250 Pa, the treatment temperature of the upper electrode was 250° C., the treatment temperature of the lower electrode was 290° C., the treatment time was 180 seconds, the total gas flow rate of hydrogen and oxygen was 1000 sccm, and the ratio of hydrogen to oxygen was variously changed.

Next, the thickness of the silicon oxide film on the Si wafer was measured with a spectroscopic ellipsometer. The measurement was conducted at in-plane 9 points on the Si wafer.

Figure 5:
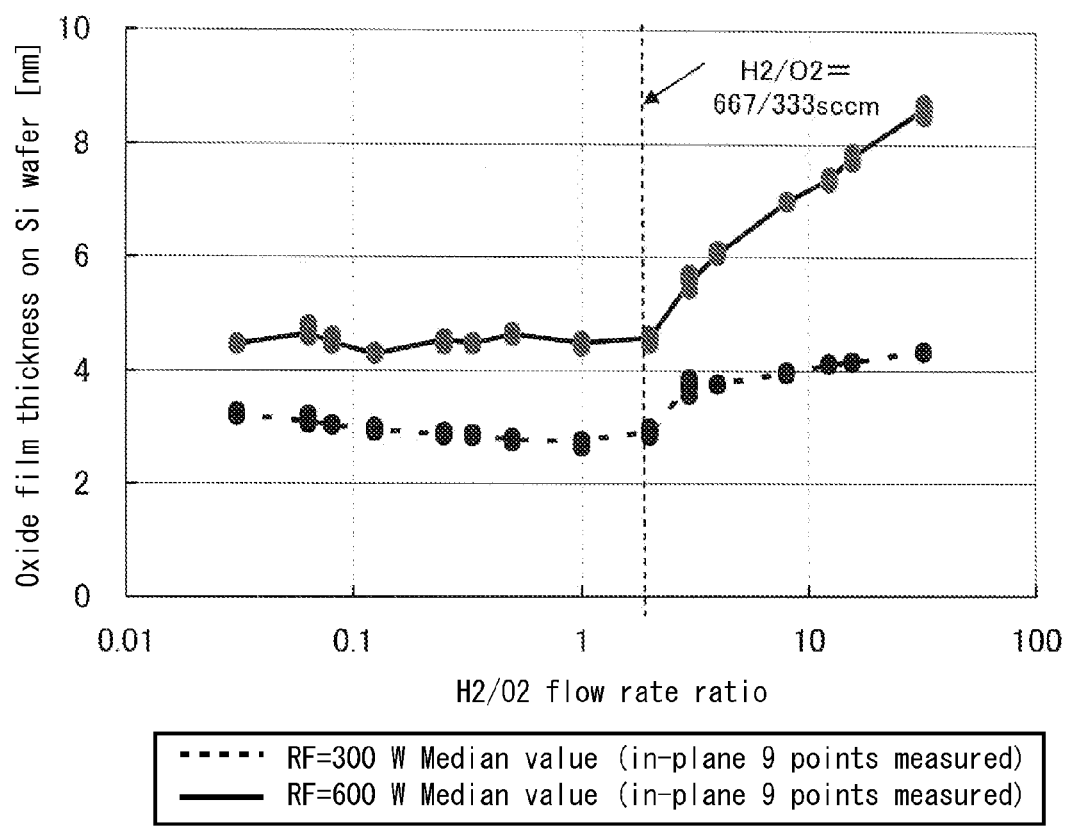
FIG. 5 shows experimental results of Example 1, that is, a relation between the $H_2/O_2$ flow rate ratio and the thickness of a silicon oxide film on a Si wafer.

FIG. 5 is a graph showing experimental results in Example 1, that is, a relation between the $H_2/O_2$ flow rate ratio and the thickness of the silicon oxide film on the Si wafer. A broken line shows the measurement results in the case where the high-frequency power was 300 W, and a solid line shows those in the case where the high-frequency power was 600 W. It was recognized from FIG. 5 that both in the case of the high-frequency power of 300 W and in the case of the high-frequency power of 600 W, when the proportion of hydrogen increases and the flow rate ratio exceeds the ratio $H_2/O_2=2/1$ (667 sccm/333 sccm) (that is, when the flow rate ratio of $H_2/O_2$ is 2 or more), preferably when the flow rate ratio of $H_2/O_2$ is 3 or more, the thickness of the oxide film is increased drastically and oxidation on the Si wafer is promoted.

Example 2

In this example, an experiment was conducted on the plasma treatment in which the surface of the microcrystalline silicon film illustrated in FIG. 3B in Embodiment 1 was exposed to plasma in the oxidizing gas atmosphere containing hydrogen and oxygen. The method and results of the experiment will be described.

The method of the experiment was the same as that of Example 1 except that the high-frequency power supplied to the electrodes of the plasma CVD apparatus was 600 W, the total gas flow rate of hydrogen and oxygen was 1000 sccm or 2000 sccm, and measurement was conducted also at higher ratios (dilution ratios) of hydrogen to oxygen than those in Example 1. A broken line shows the measurement results in the case where the total gas flow rate was 1000 sccm, and a solid line shows those in the case where the total gas flow rate was 2000 sccm.

Figure 6:
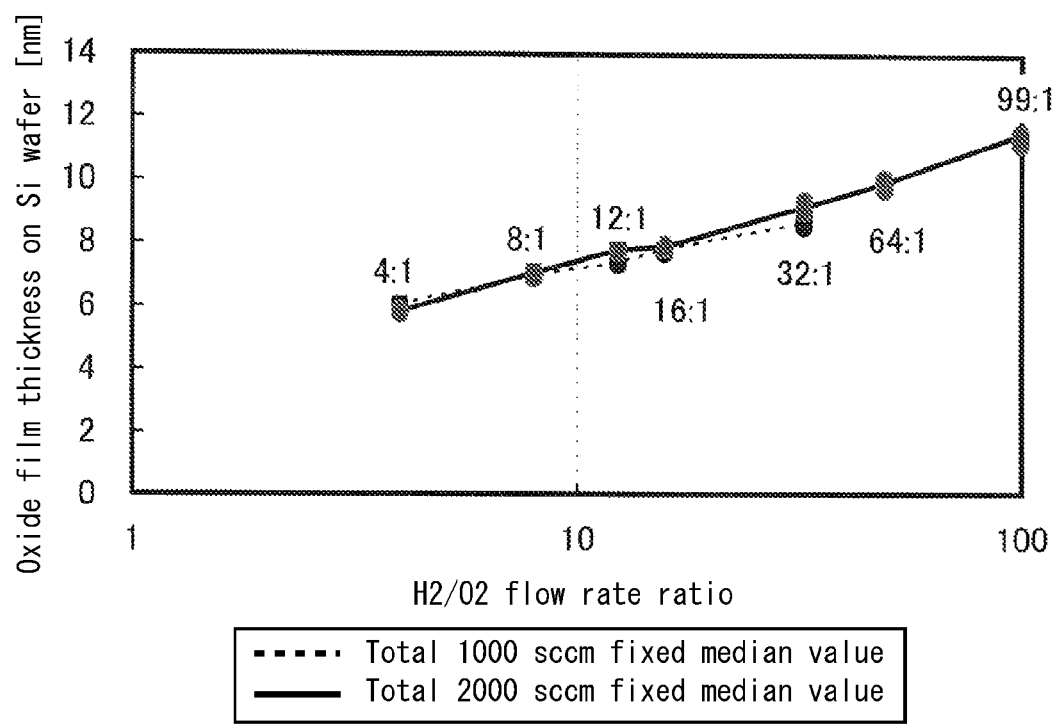
FIG. 6 shows experimental results of Example 2, that is, a relation between the $H_2/O_2$ flow rate ratio and the thickness of a silicon oxide film on a Si wafer.

FIG. 6 is a graph showing experimental results in Example 2, that is, a relation between the $H_2/O_2$ flow rate ratio and the thickness of the silicon oxide film on the Si wafer. It was recognized from FIG. 6 that even when the concentration of hydrogen is further increased from the concentration in FIG. 5, oxidation on the Si wafer can be promoted.

Example 3

In this example, an experiment was conducted on the plasma treatment in which the surface of the microcrystalline silicon film illustrated in FIG. 3B in Embodiment 1 was exposed to plasma in the oxidizing gas atmosphere containing hydrogen and oxygen. The method and results of the experiment will be described.

The method of the experiment was the same as that of Example 1 except that measurement was performed also on a case in which the treatment gas was only hydrogen without including an oxidizing gas at all and on a case in which the treatment gas was only oxygen that was not diluted with hydrogen at all; the high-frequency power supplied to the electrodes of the plasma CVD apparatus in the case where the treatment gas was only hydrogen and in the case where the treatment gas was only oxygen was 650 W; and the high-frequency power supplied to the electrodes of the plasma CVD apparatus in the other cases was 600 W.

Figure 7:
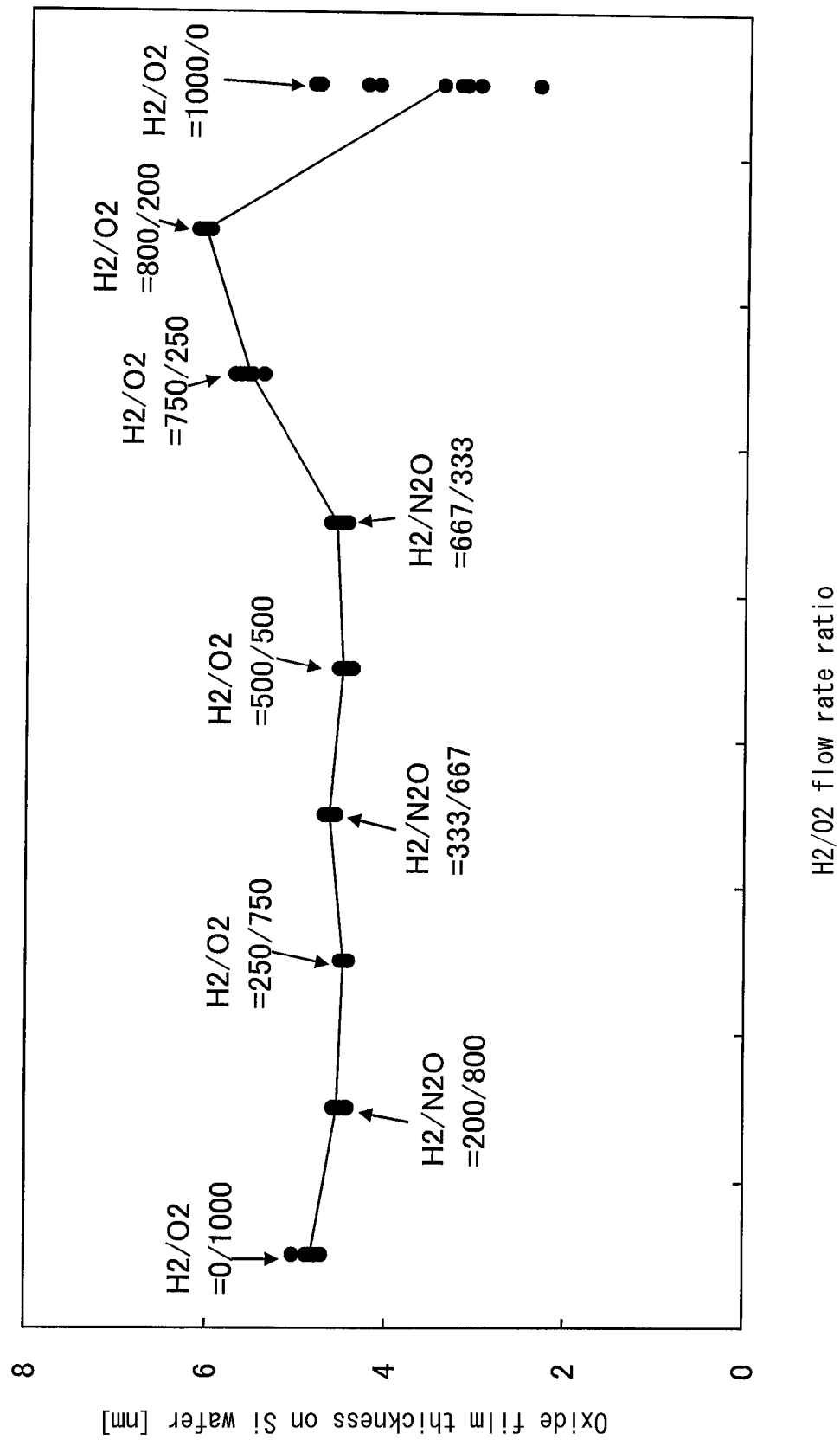
FIG. 7 shows experimental results of Example 3, that is, a relation between the $H_2/O_2$ flow rate ratio and the thickness of a silicon oxide film on a Si wafer.

FIG. 7 is a graph showing experimental results in Example 3, that is, a relation between the $H_2/O_2$ flow rate ratio and the thickness of the silicon oxide film on the Si wafer.

According to FIG. 7, the thickness of the oxide film formed using $O_2$ plasma generated in the case where the treatment gas was only oxygen was almost the same as those of the oxide films formed using treatment gases with low dilution with $H_2$. It can be guessed that the thickness of the oxide film formed in the case where the treatment gas was only oxygen is a little larger than those in the other cases with low dilution because the high-frequency power was about 50 W higher than those in the other cases with low dilution.

According to FIG. 7, the thickness of the oxide film formed using $O_2$ plasma generated in the case where the treatment gas was only oxygen varied more than those of the oxide films formed using treatment gases diluted with $H_2$. Thus, it was confirmed that a variation in the thickness of the oxide film formed on the surface of the Si wafer can be reduced by dilution with $H_2$.

Further, according to FIG. 7, it was observed that the thickness of the oxide film formed using $H_2$ plasma generated in the case where the treatment gas was only hydrogen was largely varied in the plane, that is, it increased toward the edge of the Si wafer and decreased toward the center of the Si wafer. Although not shown in FIG. 7, the fitting value obtained with a spectroscopic ellipsometer did not match a waveform that was roughly calculated with the use of the nk value of SiON; thus, it is guessed that a film with a composition other than SiON is formed.

Example 4

In this example, dual-gate thin film transistors according to Embodiment 1 were formed under the conditions described below; one was a comparative example formed in such a manner that the surface of the microcrystalline silicon film illustrated in FIG. 3B was exposed to plasma in an oxidizing gas atmosphere of $H_2O$, the others were formed in such a manner that the surface of the microcrystalline silicon film was subjected to the plasma treatment which is the same as that in Example 1.

<Film Formation Conditions>

(1) Film Formation of the Gate Insulating Film 105
Gate insulating film: SiN
Film formation apparatus: plasma CVD apparatus
Source gas and gas flow rate: $SiH_4/NH_3/N_2/H_2$=15/500/180/200 sccm
Film formation pressure: 100 Pa
High-frequency power: 200 W
Gap between parallel-plate upper and lower electrodes: 30 mm
Film formation temperature: the upper electrode 250° C./ the lower electrode 290° C.
Thickness: 300 nm (2) Plasma Treatment on the Surface of the Gate Insulating Film 105
Treatment apparatus: plasma CVD apparatus (used continuously from the film formation of the gate insulating film)
Source gas and gas flow rate: $N_2O$=400 sccm
Treatment pressure: 60 Pa
High-frequency power: 300 W
Gap between the parallel-plate upper and lower electrodes: 30 mm
Treatment temperature: the upper electrode 250° C./ the lower electrode 290° C.
Treatment time: 180 sec.

(3) Film Formation of the First Microcrystalline Silicon Film 107
Film formation apparatus: plasma CVD apparatus (used continuously from the plasma treatment of the gate insulating film)
Source gas and gas flow rate: $SiH_4/H_2/Ar$=4/750/750 sccm
Film formation pressure: 532 Pa
High-frequency power: 150 W
Gap between the parallel-plate upper and lower electrodes: 15 mm
Film formation temperature: the upper electrode 250° C./ the lower electrode 290° C.
Film formation time: 27 sec.

(4) Film Formation of the Second Microcrystalline Silicon Film 109
Film formation apparatus: plasma CVD apparatus (used continuously from the film formation of the first microcrystalline silicon film)
Source gas and gas flow rate: $SiH_4/H_2/Ar$=1.8/750/750 sccm
Film formation pressure: 5000 Pa
High-frequency power: 125 W
Gap between the parallel-plate upper and lower electrodes: 7 mm
Film formation temperature: the upper electrode 250° C./ the lower electrode 290° C.
Thickness: 65 nm (5) Film Formation of the Silicon Film 111
Film formation apparatus: plasma CVD apparatus (used continuously from the film formation of the second microcrystalline silicon film)
Source gas and gas flow rate: $SiH_4$/(1000 ppm $NH_3/H_2$)/$H_2$/Ar=20/50/700/750 sccm
Film formation pressure: 350 Pa
High-frequency power: 60 W (13.56 MHz)
Gap between parallel-plate upper and lower electrodes: 25 mm
Film formation temperature: the upper electrode 250° C./ the lower electrode 290° C.
Thickness: 80 nm (6) Film Formation of the Impurity Silicon Film 113
Film formation apparatus: plasma CVD apparatus (used continuously from the film formation of the silicon film)
Source gas and gas flow rate: $SiH_4$/(0.5% $PH_3/H_2$)/$H_2$=80/150/750 sccm
Film formation pressure: 350 Pa
High-frequency power: 30 W
Gap between the parallel-plate upper and lower electrodes: 15 mm
Film formation temperature: the upper electrode 250° C./ the lower electrode 290° C.
Thickness: 50 nm (7) Film Formation of the Insulating Film 137
Insulating film: SiN
Film formation apparatus: plasma CVD apparatus
Source gas and gas flow rate: $SiH_4/NH_3/N_2/H_2$=15/500/180/200 sccm
Film formation pressure: 100 Pa
High-frequency power: 200 W
Gap between the parallel-plate upper and lower electrodes: 30 mm
Film formation temperature: the upper electrode 250° C./the lower electrode 290° C.
Thickness: 300 nm (8) Plasma Treatment on the Surface of the Microcrystalline Silicon Region 133a
(8-1) Example
Treatment apparatus: plasma CVD apparatus
Treatment gas and gas flow rate: $H_2/O_2$=500 sccm/500 sccm, 667 sccm/333 sccm, 800 sccm/200 sccm, 925 sccm/75 sccm, 970 sccm/30 sccm
Treatment pressure: 1250 Pa
High-frequency power: 600 W
Gap between the parallel-plate upper and lower electrodes: 15 mm
Treatment temperature: the upper electrode 250° C./the lower electrode 290° C.
Treatment time: 180 sec.
(8-2) Comparative Example
Treatment apparatus: plasma CVD apparatus
Treatment gas and gas flow rate: $H_2O$=300 sccm Treatment pressure: 67 Pa
High-frequency power: 1800 W
Treatment time: 180 sec.

Figure 8:
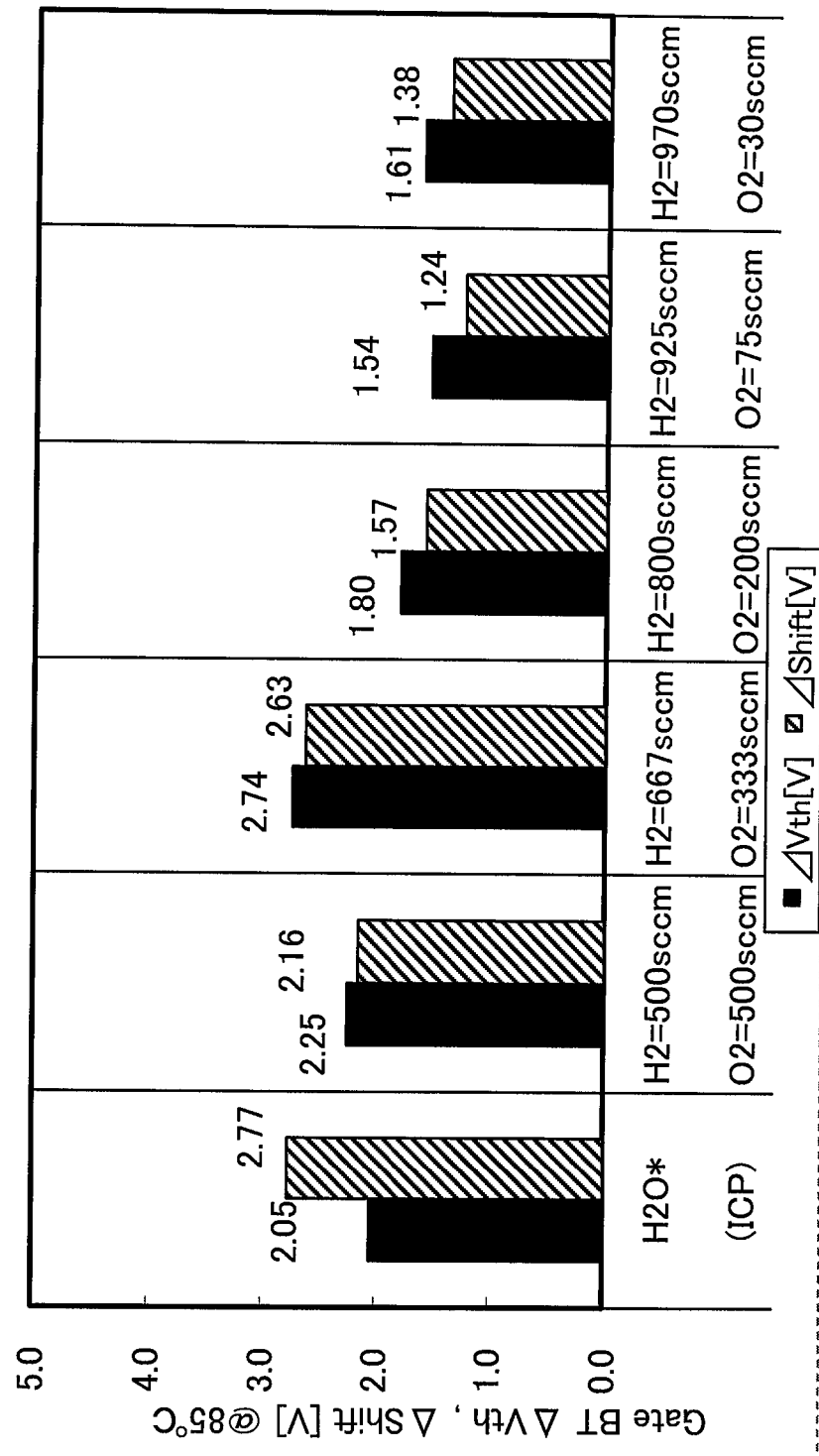
FIG. 8 shows results of a gate BT test in Example 4.

Next, initial characteristics measurement and the gate BT test under heated condition were conducted on the thin film transistors of the above example and the thin film transistor of the comparative example. As a result, there was no significant difference in initial characteristics, but was a difference in reliability in the gate BT test under the heated condition as shown in FIG. 8.

<Gate BT Test>

The gate BT test is a method for examining the reliability of a transistor and is a bias-temperature stress test. The gate BT test is one type of acceleration test to evaluate a change in transistor characteristics caused by long-time use in a short time. In particular, the amount of change in the threshold voltage (also referred to as Vth) of a transistor between before and after the gate BT test is an important indicator for examining reliability. The smaller amount of change in threshold voltage between before and after the gate BT test means higher reliability.

Specifically, the temperature of a substrate over which a transistor is formed is set at fixed temperature (85° C.), the potentials of a source and a drain of the transistor are set to be almost equal, and a gate is supplied with a potential different from those of the source and the drain for a certain period. The gate BT test in the case where the potential applied to the gate is higher than the potentials of the source and the drain is referred to as a positive gate BT test, and the gate BT test in the case where the potential applied to the gate is lower than the potentials of the source and the drain is referred to as a negative gate BT test.

According to FIG. 8, when the proportion of hydrogen increases and the flow rate ratio exceeds the ratio $H_2/O_2=2/1$ (667 sccm/333 sccm), preferably when the flow rate ratio of $H_2/O_2$ is 4 or more, ΔShift and ΔVth of the thin film transistor, which are deterioration amounts by the positive gate BT test, are both reduced. This may result from the recovery of damage on the back channel surface by the plasma oxidation treatment. Note that ΔShift means the amount of change in shift value. Further, ΔVth means the amount of change in threshold voltage. Here, the shift value is defined as a gate voltage at the intersection of a line having the highest inclination of a curve plotted with gate voltage as the horizontal axis and the logarithm of drain current as the vertical axis, and a line representing a drain current of $1\times10^{-12}$ A.

Example 5

In this example, single-gate thin film transistors according to Embodiment 1 were formed under the conditions described below; one was formed in such a manner that the surface of the gate insulating film 105 illustrated in FIG. 1A was subjected to the plasma treatment which is the same as that in Example 1, the others were a comparative example 1 and a comparative example 2 which were formed in such a manner that the surface of the gate insulating film was exposed to plasma in an oxidizing gas atmosphere of $N_2O$ or $O_2$.

<Film Formation Conditions>

(b 1) Film Formation of the Gate Insulating Film 105 (Common Among Example and the Comparative Examples)
Gate insulating film: SiN
Film formation apparatus: plasma CVD apparatus
Source gas and gas flow rate: $SiH_4/NH_3/N_2/H_2$=15/500/180/200 sccm
Film formation pressure: 100 Pa
High-frequency power: 200 W
Gap between parallel-plate upper and lower electrodes: 30 mm
Film formation temperature: the upper electrode 250° C./the lower electrode 290° C.
Thickness: 300 nm (2) Plasma Treatment on the Surface of the Gate Insulating Film 105

(2-1) Example
Treatment apparatus: plasma CVD apparatus (used continuously from the film formation of the gate insulating film)
Treatment gas and gas flow rate: $H_2/O_2$=800 sccm/200 sccm
Treatment pressure: 1250 Pa
High-frequency power: 900 W
Gap between the parallel-plate upper and lower electrodes: 15 mm
Treatment temperature: the upper electrode 250° C./the lower electrode 290° C.
Treatment time: 180 sec.

(2-2) Comparative Example 1
Treatment apparatus: plasma CVD apparatus (used continuously from the film formation of the gate insulating film)
Treatment gas and gas flow rate: $N_2O$=400 sccm
Treatment pressure: 60 Pa
High-frequency power: 300 W
Gap between the parallel-plate upper and lower electrodes: 30 mm
Treatment temperature: the upper electrode 250° C./ the lower electrode 290° C.
Treatment time: 180 sec.

(2-3) Comparative Example 2
Treatment apparatus: plasma CVD apparatus (used continuously from the film formation of the gate insulating film)
Treatment gas and gas flow rate: $O_2$=1000 sccm
Treatment pressure: 1250 Pa
High-frequency power: 900 W
Gap between the parallel-plate upper and lower electrodes: 15 mm
Treatment temperature: the upper electrode 250° C./ the lower electrode 290° C.
Treatment time: 180 sec.

(3) Film Formation of the First Microcrystalline Silicon Film (Common Among Example and the Comparative Examples)
Film formation apparatus: plasma CVD apparatus (used continuously from the plasma treatment of the gate insulating film)
Source gas and gas flow rate: $SiH_4/H_2/Ar$=3/750/750 sccm
Film formation pressure: 1250 Pa
High-frequency power: 100 W
Gap between the parallel-plate upper and lower electrodes: 15 mm
Film formation temperature: the upper electrode 250° C./ the lower electrode 290° C.
Film formation time: 40 sec.

(4) Film Formation of the Second Microcrystalline Silicon Film (Common Among Example and the Comparative Examples)
Film formation apparatus: plasma CVD apparatus (used continuously from the film formation of the first microcrystalline silicon film)
Source gas and gas flow rate: $SiH_4/H_2/Ar$=2.0/1500/1500 sccm
Film formation pressure: 10000 Pa
High-frequency power: 350 W
Gap between the parallel-plate upper and lower electrodes: 7 mm
Film formation temperature: the upper electrode 250° C./the lower electrode 290° C.
Thickness: 65 nm (5) Film Formation of the Third Microcrystalline Silicon Film (With the Use of Cycle Flow Process in which the Flow Rate of $SiH_4$ is Alternately Increased and Decreased)
Film formation apparatus: plasma CVD apparatus (used continuously from the film formation of the second microcrystalline silicon film)
Gas flow rate and time of Source gas: $SiH_4$ (High/Low=1/0.1 sccm, High/Low=10/5 sec.)

$H_2/Ar$=1500 sccm/1500 sccm

Figure 9:
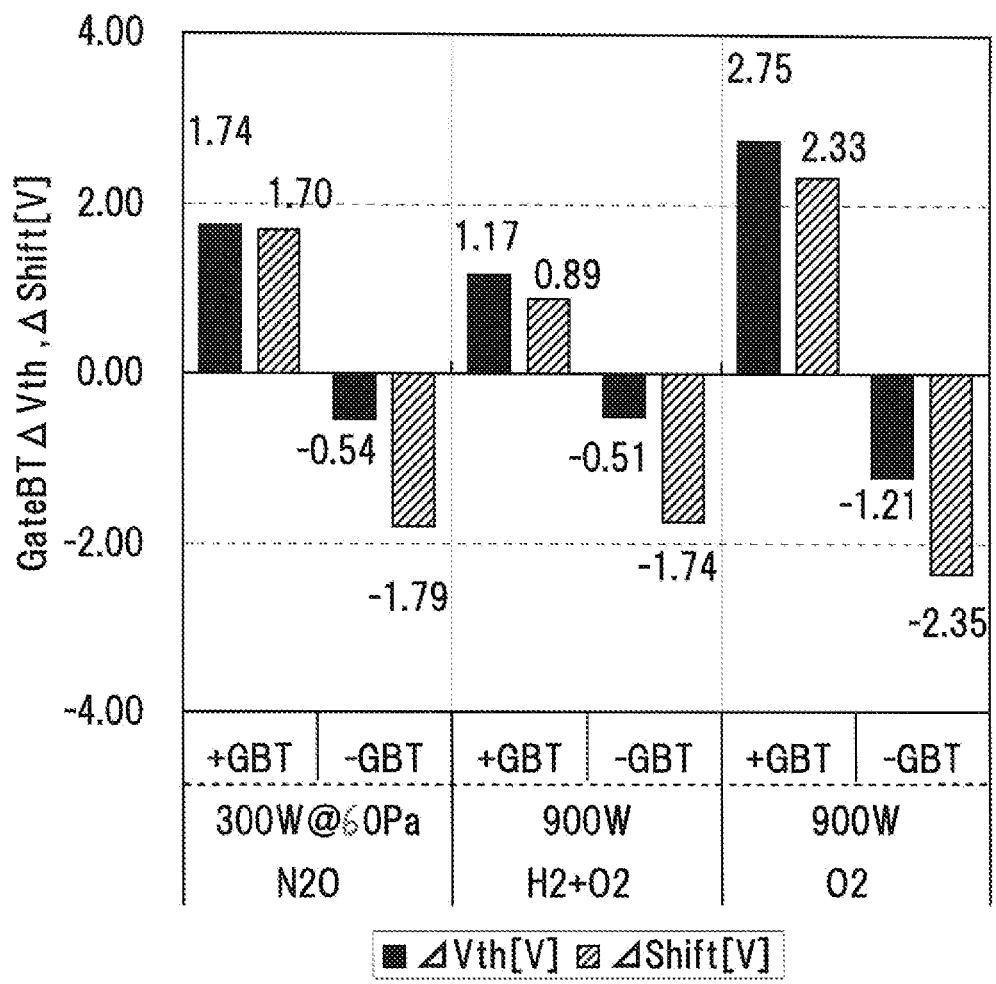
FIG. 9 shows results of a gate BT test in Example 5.

Film formation pressure: 10000 Pa
High-frequency power: 350 W
Gap between the parallel-plate upper and lower electrodes: 25 mm
Film formation temperature: the upper electrode 250° C./the lower electrode 290° C.
Thickness: 25 nm
(6) Film Formation of the Silicon Film 111 (Common Among Example and the Comparative Examples)
Film formation apparatus: plasma CVD apparatus (used continuously from the film formation of the second microcrystalline silicon film)
Source gas and gas flow rate: $SiH_4$/(1000 ppm $NH_3/H_2$)/$H_2$/Ar=20/50/700/750 sccm
Film formation pressure: 350 Pa
High-frequency power: 60 W (13.56 MHz)
Gap between the parallel-plate upper and lower electrodes: 25 mm
Film formation temperature: the upper electrode 250° C./the lower electrode 290° C.
Thickness: 80 nm
(7) Film Formation of the Impurity Silicon Film 113 (Common Among Example and the Comparative Examples)
Film formation apparatus: plasma CVD apparatus (used continuously from the film formation of the silicon film)
Source gas and gas flow rate: $SiH_4$/(0.5% $PH_3/H_2$)/$H_2$=99/180/1221 sccm
Film formation pressure: 1050 Pa
High-frequency power: 60 W (pulsed discharge, 10 kHz, ON 30%, OFF 70%)
Gap between the parallel-plate upper and lower electrodes: 15 mm
Film formation temperature: the upper electrode 250° C./the lower electrode 290° C.
Thickness: 50 nm Next, initial characteristics measurement and the gate BT test under heated condition were conducted on the thin film transistor of the above example and the thin film transistors of the comparative examples 1 and 2 in a manner similar to that of Example 4. As a result, it was recognized that as illustrated in FIG. 9, initial characteristics and reliability are both high in Example formed using the plasma treatment capable of promoting oxidation, as compared to those in the comparative examples 1 and 2 formed using the plasma treatment in which the surface of the gate insulating film 105 was exposed to plasma in the oxidizing gas atmosphere of $N_2O$ or $O_2$. That is, with the use of plasma treatment using a mixed gas of oxygen diluted with hydrogen, oxidation is promoted by hydrogen and thereby characteristics of a thin film transistor can be improved.

Example 6

In this example, an experiment was conducted on the plasma treatment in which the surface of the gate insulating film 105 illustrated in FIG. 1A in Embodiment 2 was exposed to plasma in the oxidizing gas atmosphere containing hydrogen and $N_2O$. The method and results of the experiment will be described.

The method of the experiment was as follows. First, a Si wafer was subjected to treatment with HF for 90 seconds, so that an oxide film on a surface of the Si wafer was removed. Next, the Si wafer was introduced into a plasma CVD apparatus, and plasma treatment in which the surface of the Si wafer was exposed to plasma in an oxidizing gas atmosphere containing hydrogen and $N_2O$ was performed with the plasma CVD apparatus, so that a silicon oxide film was formed on the Si wafer. The plasma treatment conditions at this time were such that parallel-plate electrodes were used for generating plasma, the gap between the electrodes was 15 mm, the high-frequency power supplied to the electrodes was 300 W, 600 W or 900 W, the treatment pressure was 1250 Pa, the treatment temperature of the upper electrode was 250° C., the treatment temperature of the lower electrode was 290° C., the treatment time was 180 seconds, the total gas flow rate of hydrogen and $N_2O$ was 1000 sccm, and the ratio of hydrogen to oxygen was variously changed.

Next, the thickness of the silicon oxide film on the Si wafer was measured with a spectroscopic ellipsometer. The measurement was conducted at in-plane 9 points on the Si wafer.

Figure 10:
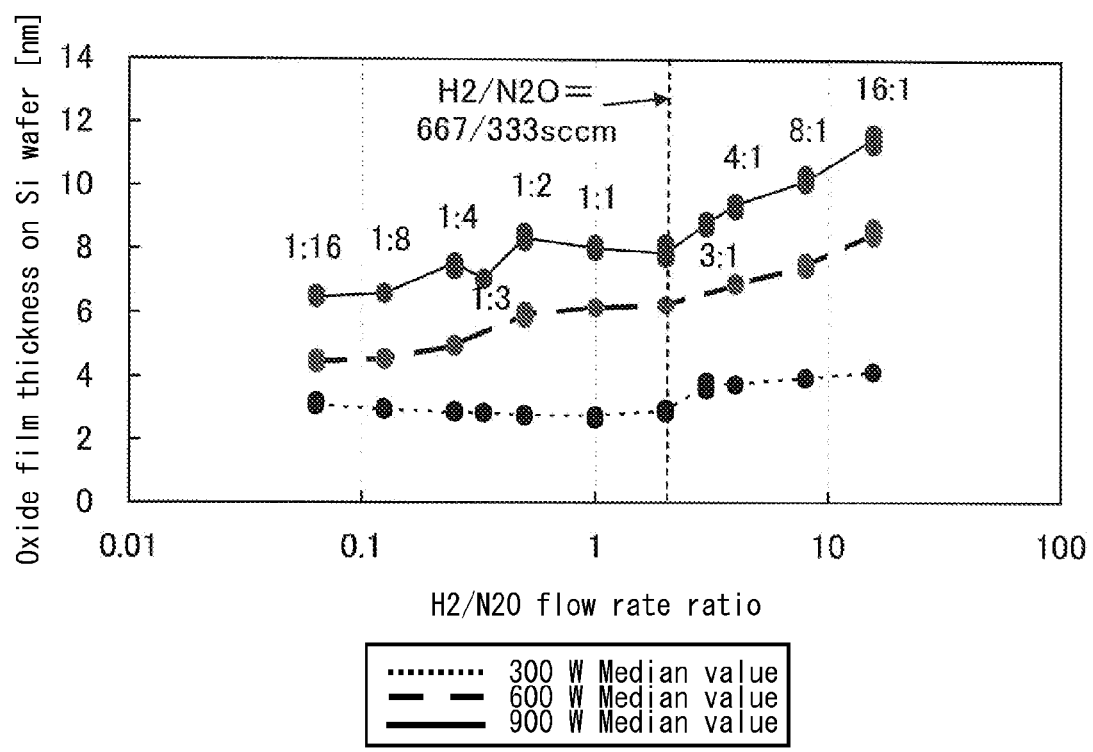
FIG. 10 shows experimental results of Example 6, that is, a relation between the $H_2/N_2O$ flow rate ratio and the thickness of a silicon oxide film on a Si wafer.

FIG. 10 is a graph showing experimental results in Example 6, that is, a relation between the $H_2/N_2O$ flow rate ratio and the thickness of the silicon oxide film on the Si wafer. It was recognized from FIG. 10 that in any of the cases where the high-frequency power was 300 W, 600 W and 900 W, when the proportion of hydrogen increases and the flow rate ratio exceeds the ratio $H_2/N_2O$=2/1 (667 sccm/333 sccm) (that is, when the flow rate ratio of $H_2$/N2O is 2 or more), the thickness of the oxide film is increased drastically and oxidation on the Si wafer is promoted.

According to Examples 1 and 6, it can be found that when the flow rate ratio of hydrogen gas/an oxidizing gas is 2 or more, oxidation on the Si wafer is promoted.

That is, it was confirmed that addition of a hydrogen gas to an oxidizing gas promotes oxidation in plasma treatment.

Considerations of Examples 1 to 6

The reason why oxidation is promoted by addition of a large amount of $H_2$ to an oxidizing gas will be considered. It can be guessed that in the case of using a mixed gas of $H_2$ and $O_2$ or a mixed gas of $H_2$ and $N_2O$ in the plasma treatment in Examples 1 to 6, OH radicals are generated during plasma discharge and oxidation is caused owing to the effect of the OH radicals.

Figure 11:
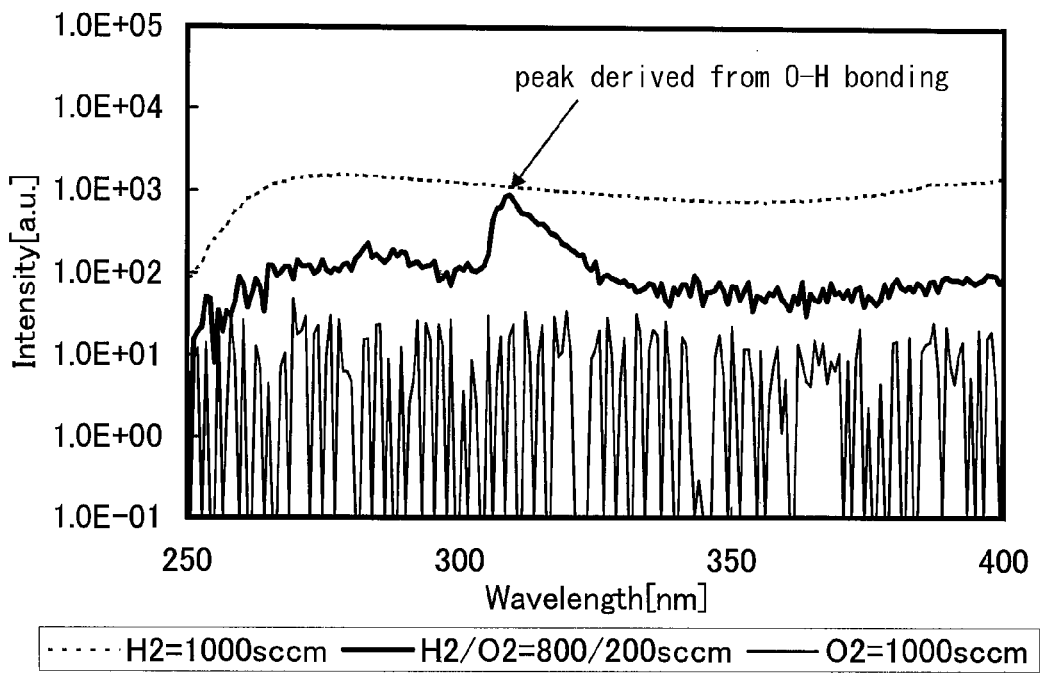
FIG. 11 shows spectroscopic spectra of $H_2$, $O_2$, and a mixed gas of $H_2$ and $O_2$ at the time of plasma discharge.
Figure 12:
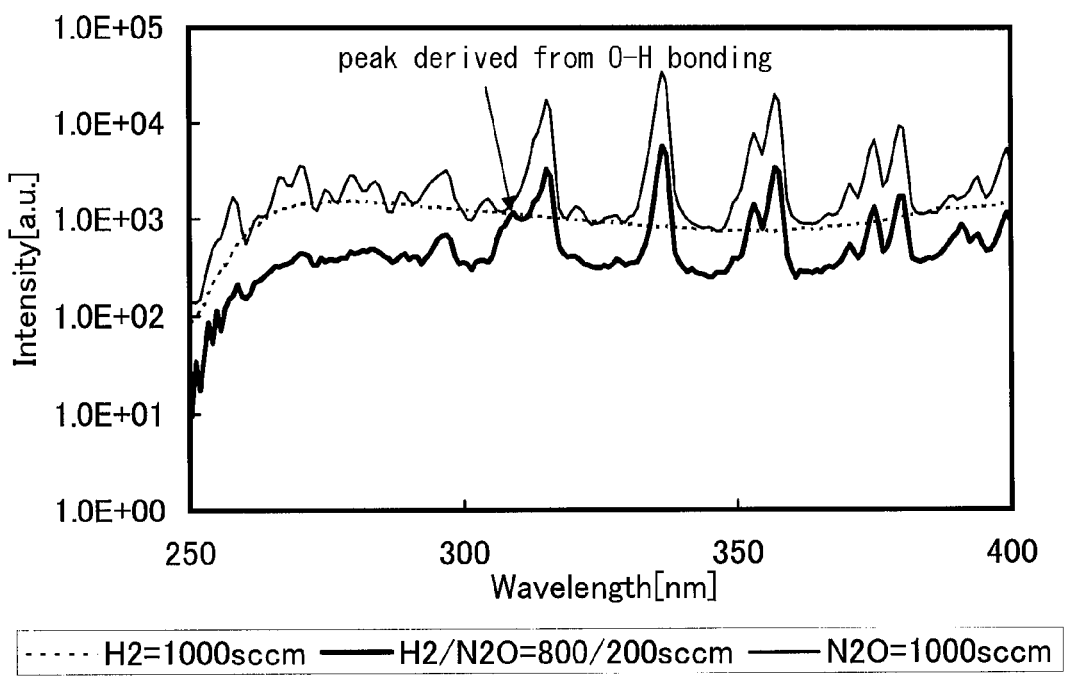
FIG. 12 shows spectroscopic spectra of $H_2$, $N_2O$, and a mixed gas of $H_2$ and $N_2O$ at the time of plasma discharge.
Figure 13:
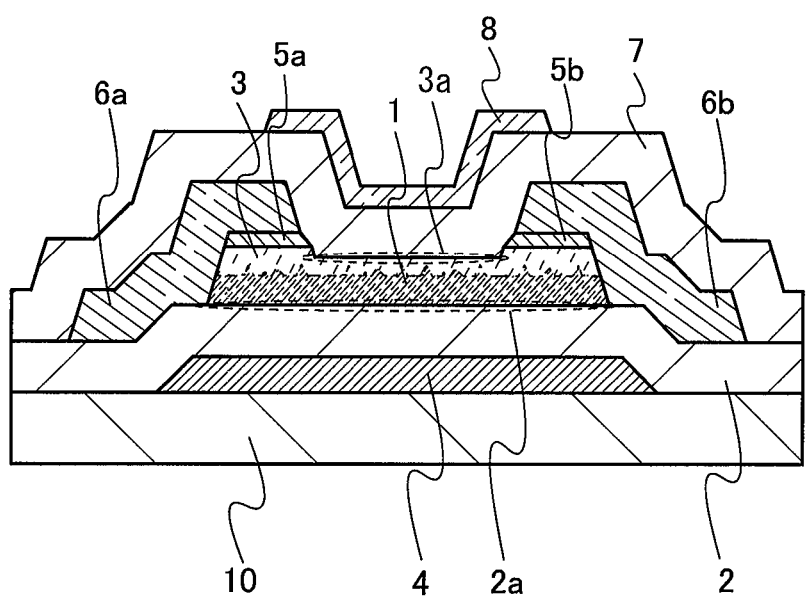
FIG. 13 is a cross-sectional view of an inverted staggered bottom-gate thin film transistor.

FIG. 11 and FIG. 12 show actually observed spectroscopic spectra of $H_2$, $O_2$, $N_2O$, and a mixed gas of these gasses at the time of plasma discharge. In FIG. 11, a broken line shows a spectroscopic spectrum at the time of plasma discharge in the case of flowing $H_2$ at a flow rate of 1000 sccm, a thick solid line shows that in the case of flowing a mixed gas of $H_2$ and $O_2$ at flow rates of 800 sccm and 200 sccm, respectively, and a thin solid line shows that in the case of flowing $O_2$ at a flow rate of 1000 sccm. In FIG. 12, a broken line shows a spectroscopic spectrum at the time of plasma discharge in the case of flowing $H_2$ at a flow rate of 1000 sccm, a thick solid line shows that in the case of flowing a mixed gas of $H_2$ and $N_2O$ at flow rates of 800 sccm and 200 sccm, respectively, and a thin solid line shows that in the case of flowing $N_2O$ at a flow rate of 1000 sccm. In these spectra, a peak (light emission derived from O—H bonding) is observed in a spectroscopic spectrum range of 309 nm to 310 nm in the case of the mixed gas of $H_2$ and $O_2$ and the mixed gas of $H_2$ and $N_2O$, while such a peak is not observed in the case of a single gas of $H_2$, $O_2$, or $N_2O$. This might suggest that OH radicals are generated by plasma discharge with a mixture of a $H_2$ gas and an oxidizing gas.

When the amount of $H_2$ is increased in the above-described mixed gases, the amount of $O_2$ or $N_2O$ becomes smaller than that of $H_2$ at a certain flow rate ratio. In such a situation, there arises an excess of H atoms for the number of O atoms in producing OH radicals. It is probable that the excess H atoms become H radicals during plasma discharge and cut bonds on the substrate surface, which are Si—Si bonds on the surface of single crystal silicon or a silicon film and Si—N bonds on the SiNx surface. Accordingly, the OH radicals may be likely to affect the bonds; as a result, oxidation of the film surface may be promoted.

This application is based on Japanese Patent Application Serial No. 2011-093226 filed with Japan Patent Office on Apr. 19, 2011, the entire contents of which are hereby incorporated by reference.

What is claimed is:

1. A method for manufacturing a semiconductor device comprising a thin film transistor including a gate electrode, a gate insulating film containing nitrogen, and a microcrystalline semiconductor film, the method comprising the steps of:
   performing plasma treatment on the microcrystalline semiconductor film in an oxidizing gas atmosphere containing hydrogen and an oxidizing gas;
   forming an insulating film over the microcrystalline semiconductor film; and
   forming a back gate electrode over the insulating film,
   wherein $c/d \geq 2$ and $d>0$ are satisfied, where an amount of the hydrogen and an amount of the oxidizing gas in the oxidizing gas atmosphere are c and d, respectively.

2. The method for manufacturing a semiconductor device according to claim 1, wherein the oxidizing gas includes at least one of oxygen, $NO_2$, and $N_2O$.

3. A method for manufacturing a semiconductor device comprising a thin film transistor including a gate electrode, a gate insulating film containing nitrogen, and a microcrystalline semiconductor film, the method comprising the steps of:
   forming the microcrystalline semiconductor film over the gate insulating film;
   forming an amorphous semiconductor film over the microcrystalline semiconductor film;
   performing plasma treatment on the amorphous semiconductor film in an oxidizing gas atmosphere containing hydrogen and an oxidizing gas;
   forming an insulating film over the amorphous semiconductor film; and
   forming a back gate electrode over the insulating film,
   wherein $c/d \geq 2$ and $d>0$ are satisfied, where an amount of the hydrogen and an amount of the oxidizing gas in the oxidizing gas atmosphere are c and d, respectively.

4. The method for manufacturing a semiconductor device according to claim 3, wherein the oxidizing gas includes at least one of oxygen, $NO_2$, and $N_2O$.

* * * * *